(12) United States Patent
Van Zyl

(10) Patent No.: US 11,972,927 B2
(45) Date of Patent: *Apr. 30, 2024

(54) FREQUENCY TUNING FOR MODULATED PLASMA SYSTEMS

(71) Applicant: Advanced Energy Industries, Inc., Denver, CO (US)

(72) Inventor: Gideon Van Zyl, Fort Collins, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/973,969

(22) Filed: Oct. 26, 2022

(65) Prior Publication Data

US 2023/0086313 A1 Mar. 23, 2023

Related U.S. Application Data

(63) Continuation of application No. 16/934,257, filed on Jul. 21, 2020, now Pat. No. 11,515,123, which is a
(Continued)

(51) Int. Cl.
 *H01J 37/32* (2006.01)
 *H03H 7/01* (2006.01)
(Continued)

(52) U.S. Cl.
 CPC .. *H01J 37/32183* (2013.01); *H01J 37/32128* (2013.01); *H01J 37/32165* (2013.01); *H03H 7/0138* (2013.01); *H03H 7/38* (2013.01); *H05H 1/46* (2013.01); *H01J 2237/24585* (2013.01); *H05H 2242/26* (2021.05)

(58) Field of Classification Search
 None
 See application file for complete search history.

(56) References Cited

U.S. PATENT DOCUMENTS

| | | | |
|---|---|---|---|
| 3,733,608 A | 5/1973 | McGhay et al. | |
| 5,643,364 A | 7/1997 | Zhao et al. | |

(Continued)

FOREIGN PATENT DOCUMENTS

| | | |
|---|---|---|
| JP | 2004-152606 | 5/2004 |
| JP | 2008-019494 | 1/2008 |

(Continued)

OTHER PUBLICATIONS

Japanese Official Action, dated Jun. 28, 2023, Japanese Patent Office.
(Continued)

*Primary Examiner* — Srinivas Sathiraju
(74) *Attorney, Agent, or Firm* — Neugeboren O'Dowd PC

(57) ABSTRACT

Plasma processing systems and methods are disclosed. The plasma processing system includes a high-frequency generator configured to deliver power to a plasma chamber and a low-frequency generator configured to deliver power to the plasma chamber. A filter is coupled between the plasma chamber and the high-frequency generator, and the filter suppresses mixing products of high frequencies produced by the high-frequency generator and low frequencies produced by the low-frequency generator.

15 Claims, 18 Drawing Sheets

Related U.S. Application Data continuation-in-part of application No. 16/230,923, filed on Dec. 21, 2018, now Pat. No. 10,720,305.

(51) Int. Cl.
  *H03H 7/38* (2006.01)
  *H05H 1/46* (2006.01)

(56) References Cited

U.S. PATENT DOCUMENTS

| | | | |
|---|---|---|---|
| 6,020,794 | A | 2/2000 | Wilbur |
| 6,046,641 | A | 4/2000 | Chawla |
| 6,537,421 | B2 | 3/2003 | Drewery |
| 6,562,190 | B1 | 5/2003 | Kuthi et al. |
| 6,587,019 | B2 | 7/2003 | Chawla et al. |
| 6,631,693 | B2 | 10/2003 | Hilliker |
| 6,703,080 | B2 * | 3/2004 | Reyzelman ............ H05H 1/46 |
| | | | 204/192.1 |
| 6,724,255 | B2 * | 4/2004 | Kee ..................... H03F 3/2176 |
| | | | 330/251 |
| 6,887,339 | B1 | 5/2005 | Goodman et al. |
| 7,042,311 | B1 | 5/2006 | Hilliker et al. |
| 7,049,751 | B2 | 5/2006 | Blackburn et al. |
| 7,825,719 | B2 * | 11/2010 | Roberg ................. H03L 7/087 |
| | | | 327/530 |
| 7,967,944 | B2 | 6/2011 | Shannon et al. |
| 7,970,562 | B2 | 6/2011 | Van Zyl |
| 8,018,164 | B2 | 9/2011 | Shannon et al. |
| 8,330,432 | B2 | 12/2012 | Van Zyl et al. |
| 8,576,013 | B2 * | 11/2013 | Coumou .................. H03F 1/32 |
| | | | 330/305 |
| 9,059,678 | B2 | 6/2015 | Long et al. |
| 9,595,424 | B2 | 3/2017 | Marakhtanov et al. |
| 9,596,744 | B2 | 3/2017 | Leeser |
| 9,635,750 | B2 | 4/2017 | Cheung et al. |
| 9,721,759 | B1 | 8/2017 | Karlquist |
| 9,773,643 | B1 | 9/2017 | Singhal |
| 9,984,859 | B2 | 5/2018 | Marakhtanov et al. |
| 10,026,592 | B2 | 7/2018 | Chen et al. |
| 10,141,163 | B2 | 11/2018 | Lill et al. |
| 10,224,184 | B2 | 3/2019 | Van Zyl |
| 10,249,476 | B2 | 4/2019 | Marakhtanov et al. |
| 10,312,064 | B2 | 6/2019 | Grede et al. |
| 10,340,879 | B2 | 7/2019 | Mavretic et al. |
| 10,623,012 | B2 * | 4/2020 | Van Zyl .................. G06F 17/18 |
| 10,720,305 | B2 * | 7/2020 | Van Zyl ............. H01J 37/32165 |
| 10,944,416 | B2 * | 3/2021 | Van Zyl .................... H03H 7/38 |
| 11,158,488 | B2 * | 10/2021 | Radomski ......... H01J 37/32165 |
| 11,368,163 | B2 * | 6/2022 | Van Zyl .................... H03H 7/40 |
| 11,515,123 | B2 * | 11/2022 | Van Zyl ............. H01J 37/32165 |
| 2002/0149445 | A1 | 10/2002 | Chawla et al. |
| 2007/0006972 | A1 | 1/2007 | Piptone et al. |
| 2009/0255800 | A1 | 10/2009 | Koshimizu |
| 2009/0315596 | A1 | 12/2009 | Leming et al. |
| 2010/0164561 | A1 * | 7/2010 | Roberg ................... H03L 7/183 |
| | | | 327/117 |
| 2010/0258529 | A1 | 10/2010 | Mori |
| 2012/0074844 | A1 | 3/2012 | York et al. |
| 2013/0169359 | A1 * | 7/2013 | Coumou ................. H03F 3/191 |
| | | | 330/192 |
| 2013/0313227 | A1 | 11/2013 | Katagiri |
| 2013/0320852 | A1 | 12/2013 | Kitano et al. |
| 2014/0159580 | A1 | 6/2014 | Fritsch et al. |
| 2014/0239813 | A1 | 8/2014 | Van Zyl et al. |
| 2014/0262031 | A1 | 9/2014 | Belostotskiy et al. |
| 2015/0007940 | A1 | 1/2015 | Kaneko et al. |
| 2015/0348854 | A1 | 12/2015 | Kapoor et al. |
| 2017/0330731 | A1 | 11/2017 | Van Zyl |
| 2018/0025891 | A1 | 1/2018 | Marakhtanov et al. |
| 2018/0025930 | A1 | 1/2018 | Augustyniak |
| 2018/0318459 | A1 | 11/2018 | Hancock et al. |
| 2019/0247050 | A1 | 8/2019 | Goldsmith |
| 2020/0203119 | A1 * | 6/2020 | Van Zyl ............. H01J 37/32183 |
| 2020/0266826 | A1 * | 8/2020 | Van Zyl .................. G06F 17/18 |
| 2020/0350140 | A1 * | 11/2020 | Van Zyl ................. H03H 7/0138 |
| 2021/0175050 | A1 * | 6/2021 | Van Zyl ............. H01J 37/32165 |
| 2023/0086313 | A1 * | 3/2023 | Van Zyl ............. H01J 37/32183 |

FOREIGN PATENT DOCUMENTS

| | | |
|---|---|---|
| JP | 2011-082333 | 4/2011 |
| JP | 2014-44961 | 3/2014 |
| JP | 201811050 | 1/2018 |
| KR | 20140112586 A | 9/2014 |
| WO | 2010082327 | 7/2010 |

OTHER PUBLICATIONS

Young, Lee, "International Search Report and Written Opinion Regarding International Application No. PCT/US2019/052391", dated Dec. 31, 2019, p. 11, Published in: US.

KIPO, "International Search Report and Written Opinion Regarding International Application No. PCT/US2022/016277", dated Jun. 3, 2022, p. 9, Published in: KR.

EPO, "Extended European Search Report Re Application No. 19901022.4", dated Jul. 15, 2022, Page(s) Jul. 15, 2022, Published in: EP.

Fiona Doherty, Patent Cooperation Treaty, International Preliminary Report on Patentability, Aug. 31, 2023, The International Bureau of WIPO.

CNIPA, Notification of the first office action for application No. 201980085302.4, Jan. 12, 2024, p. 11.

* cited by examiner

Lossless filter prototype

Realized filter using lossy components

FREQUENCY TUNING FOR MODULATED PLASMA SYSTEMS

CLAIM OF PRIORITY UNDER 35 U.S.C. § 120

The present Application for Patent is a Continuation of U.S. patent application Ser. No. 16/934,257 entitled "Apparatus and System for Modulated Plasma Systems" filed 21 Jul. 2020, pending, which is a Continuation in Part of patent application Ser. No. 16/230,923 entitled "Plasma Delivery System for Modulated Plasma Systems" filed 21 Dec. 2018, and issued as U.S. Pat. No. 10,720,305 on Jul. 21, 2020, and assigned to the assignee hereof and hereby expressly incorporated by reference herein.

BACKGROUND

Field

The present disclosed embodiments relate generally to plasma processing systems, and more specifically to plasma processing systems with modulated plasma.

Background

Plasma processing systems for etching and deposition have been utilized for decades, but advancements in processing techniques and equipment technologies continue to create increasingly more complex systems. These increasingly complex systems lead to more problematic interactions between multiple generators driving the same plasma system.

SUMMARY

An aspect may be characterized as a plasma processing system that includes a high-frequency generator and a low-frequency generator that both deliver power to a plasma chamber. A filter of the system is coupled between the plasma chamber and the high-frequency generator, and the filter suppresses power outside of a bandwidth around a frequency of the high-frequency generator. The suppression of power at the frequency of the high-frequency generator is, at most, 2 dB, and the suppression of power at frequencies more than the frequency of the low-frequency generator from the frequency of the high-frequency generator is, at least, 2 dB higher than the suppression of power at the frequency of the high-frequency generator.

Another aspect may be characterized as plasma processing system that includes a high-frequency generator configured to deliver power to a plasma chamber and a low-frequency generator configured to deliver power to the plasma chamber. A filter is coupled between the plasma chamber and the high frequency generator, and the filter includes two or more helical resonators connected in parallel.

Yet another aspect may be characterized as a method for filtering power in a plasma processing system. The method includes supplying power to a plasma chamber with a high-frequency generator to ignite and sustain a plasma and supplying power to a plasma chamber with a low-frequency generator that is connected to the plasma. Power of mixing products is suppressed with a filter to limit variation of a time-varying load reflection coefficient presented to the high frequency generator.

DETAILED DESCRIPTION

Interaction between generators driving the same plasma where one of the generators modulates the load seen by another generator is becoming increasingly problematic as power levels are increased; thus, there is a need for new and improved methods and systems for dealing with this problem.

The word "exemplary" is used herein to mean "serving as an example, instance, or illustration." Any embodiment described herein as "exemplary" is not necessarily to be construed as preferred or advantageous over other embodiments.

Figure 1:
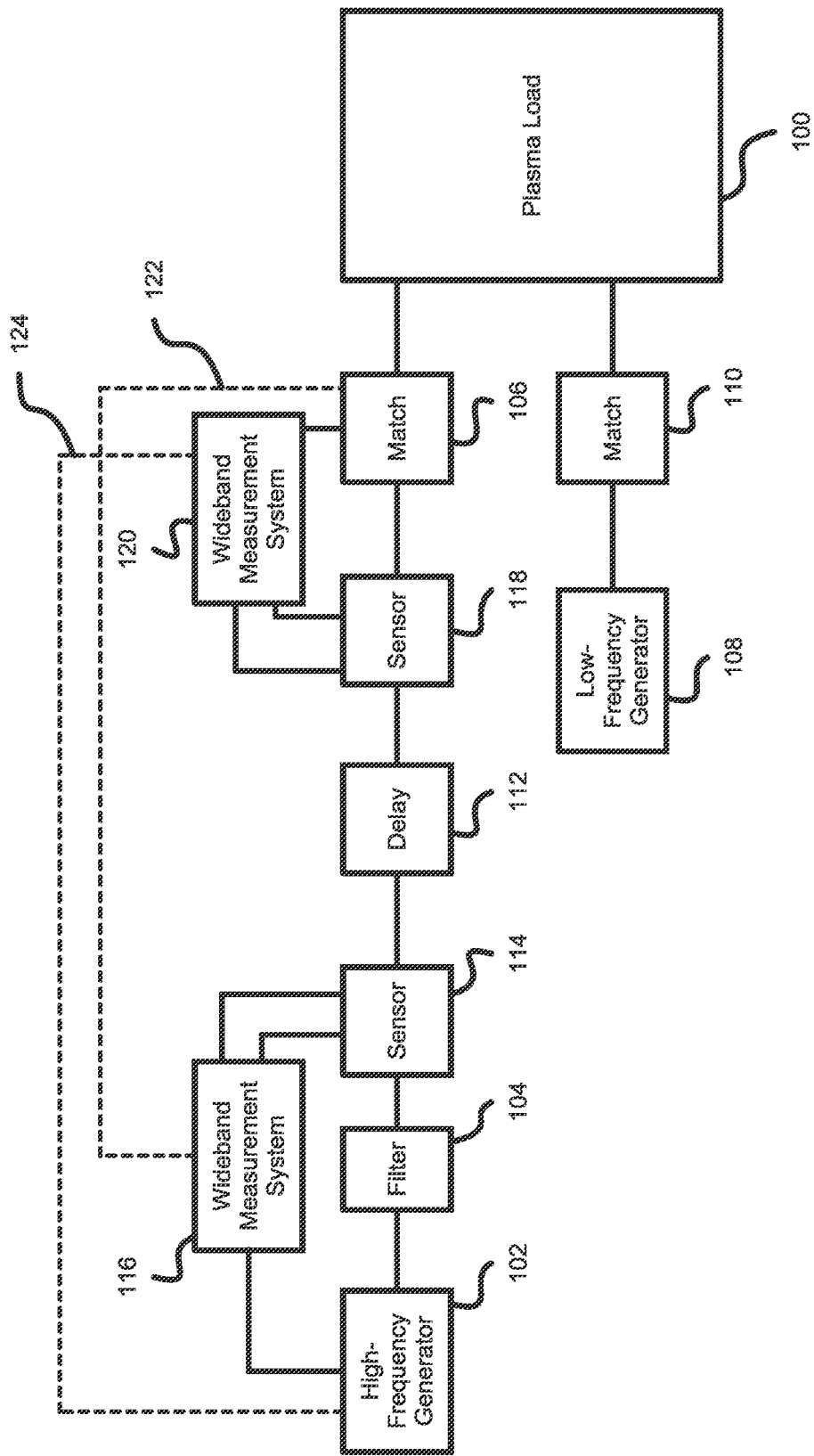
FIG. 1 is a block diagram of a plasma processing system.

Referring to FIG. 1, shown is a block diagram depicting an exemplary environment in which embodiments may be implemented. As shown, a plasma load of a plasma chamber 100 is coupled to a high-frequency generator 102 via a filter 104 and a match network 106. In addition, a low-frequency generator 108 is also coupled to the plasma load via match 110. In many applications the match 106 may be combined with the match 110. Also shown are optional wideband measurement components 114, 116, 118, and 120 and an optional delay element 112. The optional delay element 112 can be realized using a length of coaxial cable or a fixed or variable RLCM (i.e., a circuit containing resistors, inductors, capacitors and coupled inductors) circuit or a circuit containing distributed circuit elements (i.e. transmission line circuits). Also shown are optional connections 122 and 124 that allow one of the optional wideband measurement systems 116, 120 to take over functionality of the other if the optional delay element 112 is properly characterized.

Although the high-frequency generator 102 and the low frequency generator 108 may each operate over a range of frequencies, in general, the high frequency generator 102 operates at a frequency that is higher than the low-frequency generator 108. In many embodiments, the high-frequency generator 102 may be a generator that delivers RF power to the plasma load in the plasma chamber 100 in the 10 MHz to 200 MHz frequency range, and the low frequency generator 108 may be, for example, in the 100 kHz to 2 MHz range. So, exemplary frequency ratios of the frequency of the low-frequency generator 108 to that of the high-frequency generator 102 are between 0.0005 and 0.2. In many embodiments for example, the frequency ratio of the frequency of the low-frequency generator 108 to that of the high-frequency generator 102 is less than 0.05, and in some embodiments the frequency ratio of the low-frequency generator 108 to the high-frequency generator 102 is less than 0.01. For example, the ratio may be 1:150 or about 0.0067.

In terms of applications, the high-frequency generator 102 may be used to ignite and sustain the plasma load in the plasma chamber 100, and the low-frequency generator 108 may be utilized to apply a periodic voltage function to a substrate support of the plasma chamber 100 to effectuate a desired distribution of ion energies at a surface of a substrate in the plasma chamber 100.

With respect to power levels, the low-frequency generator 108 may apply a relatively large amount of power (e.g., in the 10 kW to 30 kW range) to the plasma load of the plasma chamber 100. The large amount of power applied to the plasma at low frequency modulates the plasma impedance presented to a high-frequency generator 102.

Applicant has found that, in prior systems with a generator (e.g., the low-frequency generator 108) that modulates the plasma load, power is not measured at a sufficient number of mixing products generated by the system. And failure to do so is a problem that leads to errors on the order of 100% or more in power measurement. Typical approaches taken in the past (when there is low-frequency power perturbing the plasma) is to simply filter out the mixing frequency components that result from applying high frequency power to a load that is modulated at a low frequency (e.g., filtering out 59.6 MHz and 60.4 MHz components when the low and high generator frequencies are 400 kHz and 60 MHz, respectively). But when a low pass filter is utilized, the apparent complex impedance trajectory collapses to a point, and misleadingly, it appears as though the high-frequency generator 102 is delivering power into 50 ohms.

Figure 2:
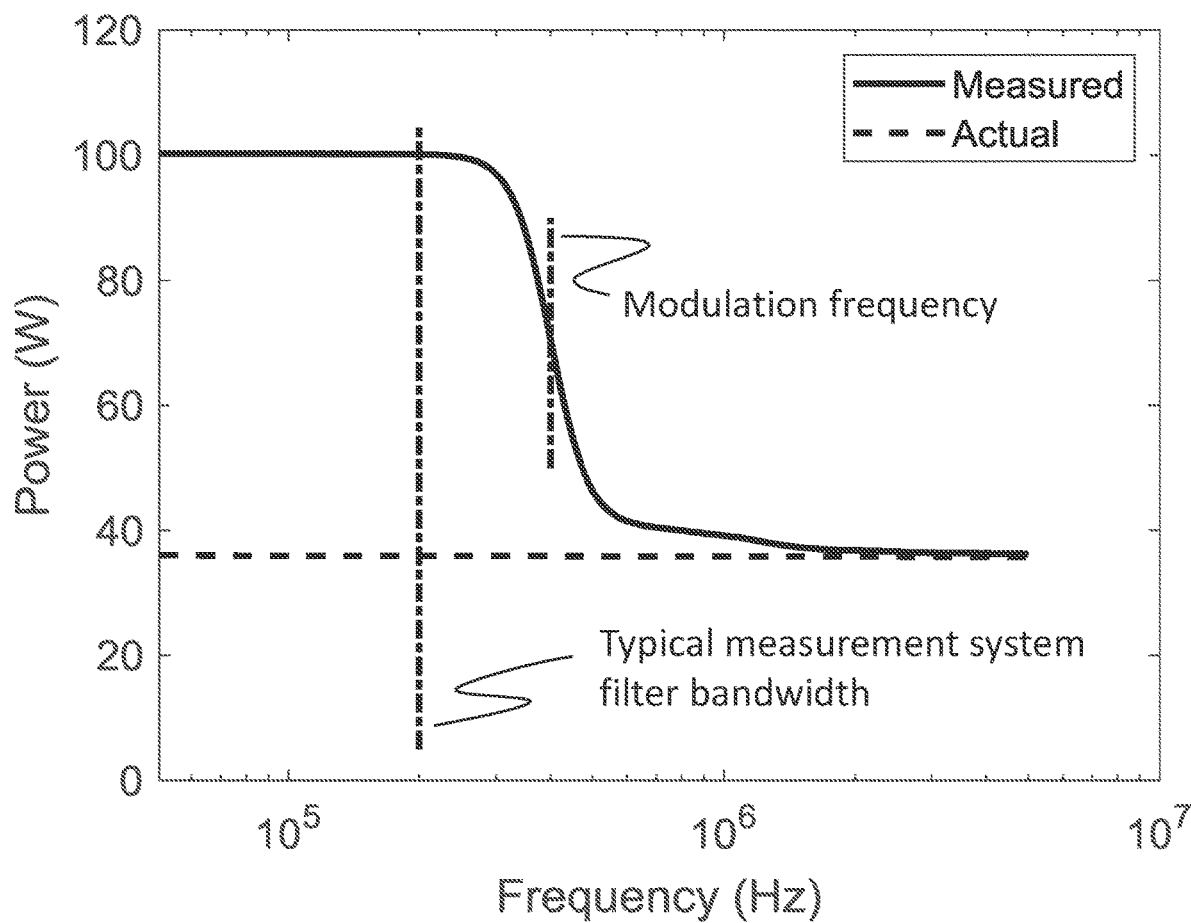
FIG. 2 is a graph depicting how power may be perceived by measuring power using different measurement-system-filter bandwidths.

Referring to FIG. 2, shown is a graph depicting how power may be perceived by measuring power using different measurement-system-filter bandwidths. The measurement system filtering is applied after down conversion or demodulation of the measured signal; thus, the measurement system filters frequency components centered on the generator output frequency. For example, a measurement system bandwidth of 100 kHz applied to a generator producing a 60 MHz output will suppress frequency components below 59.9 MHz and above 60.1 MHz. As shown, when the filter bandwidth of a measuring system is selected to be less than the modulation frequency of the plasma, then it appears as though there is much less reflected power than there actually is (so, it appears as though only forward power is going to the plasma load), but in reality, that is not what is happening.

In contrast, when power is measured with sufficient bandwidth (e.g., by one or both of the wideband measurement systems 116, 120), it is clear that only a fraction of the power (e.g., only half the power) is going to the plasma load. So, an aspect of the present disclosure includes adjusting a measurement system so that its filter bandwidth exceeds the modulation frequency to capture mixing products at higher frequencies. U.S. Pat. No. 7,970,562 entitled System, Method, and Apparatus for Monitoring Power (which is incorporated herein by reference) discloses types of sensors (e.g., directional coupler or voltage/current (VI) sensor) that may be used to realize the sensors 114, 118 in addition to the sampling and processing techniques that may be utilized by the wideband measurement systems 116, 120 to achieve a filter bandwidth that is capable of capturing information about the mixing products at higher frequencies. It should be noted that the filter bandwidth if the measurement systems 116, 120 should not be confused with the filter 104.

Figure 3A:
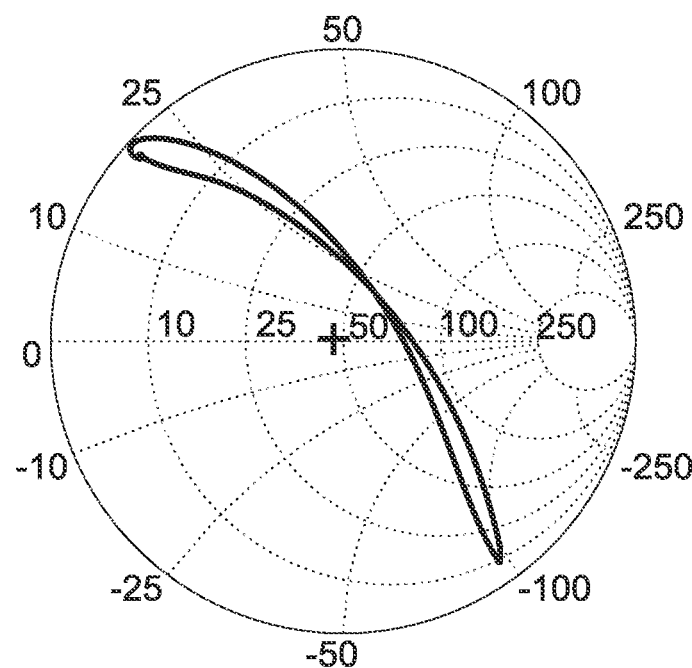
FIGS. 3A and 3B are graphs depicting modulation of load reflection coefficient.
Figure 3B:
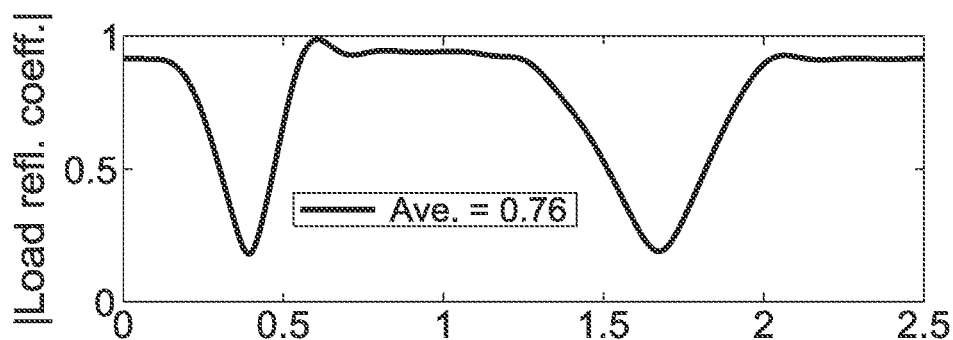
Figure 3C:
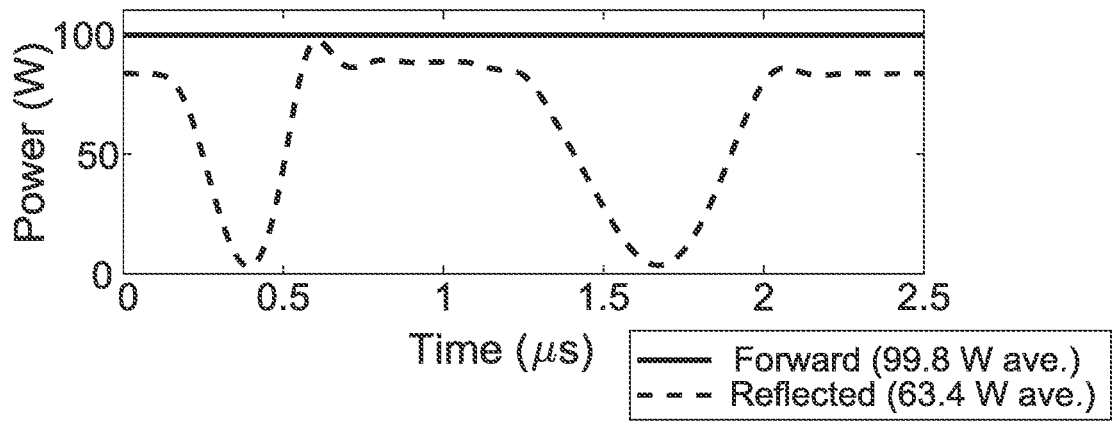
FIG. 3C is a graph depicting the resulting reflected power that may be seen by the high-frequency generator when the filter depicted in FIG. 1 is not utilized.

Another problem is that the high-frequency generator 102 needs to deliver power to a time varying load (the modulated plasma load) where the time-averaged load reflection coefficient magnitude is high. Referring to FIGS. 3A and 3B for example, shown are graphs depicting the load reflection coefficient that is seen by the high frequency generator 102 over the time period of one cycle of the low frequency generator 108, and FIG. 3C is a graph depicting resulting reflected power that may be seen by the high-frequency generator 102 when the filter 104 depicted in FIG. 1 is not utilized. As shown, the peak load reflection coefficient magnitude seen by the high-frequency generator 102 may be close to 1 (and may even exceed 1 meaning net power is flowing from the plasma load to the high-frequency generator 102) while an average load reflection coefficient magnitude seen by the high-frequency generator 102 may be 0.76. The relatively high load reflection coefficient magnitude means that, in general, the high-frequency generator 102 may struggle to apply a desired level of power and be more susceptible to failure. Thus, the high-frequency generator 102 may require many more power devices (bipolar transistors, MOSFETS, etc.) than would normally be required to deliver the required amount of power to the plasma chamber 100.

Aspects of the disclosure herein are directed to solutions to remove or mitigate against the effects of plasma modulation. An aspect depicted in FIG. 1 is the depicted filter 104. As discussed above, absent the depicted filter 104, the modulated plasma load presents a time varying nonlinear load to the high-frequency generator 102, which presents challenging problems.

In many embodiments, the filter 104 depicted in FIG. 1 may be implemented as an extremely-narrow bandwidth, high-power filter that is disposed between the high-frequency generator 102 and the plasma chamber 100. The filter 104 may have reasonably low losses at the frequency of the high-frequency generator 102 and suppress the mixing products sufficiently to limit the variation in load reflection coefficient presented to the high-frequency generator 102 at the input to the filter 104 while being stable under application of high power. When implemented, the filter 104 may have a narrow bandwidth to filter the side-band frequencies. As used herein, bandwidth is defined as a frequency range that exists between a lower-cutoff frequency and a higher-cutoff frequency, wherein each of the cutoff frequencies is 3 dB below the maximum center or resonant peak while attenuating or weakening other frequencies outside of these two points by more than 3 dB.

In some embodiments for example, the low-frequency-generator 108 is realized by a 400 kHz generator and the high-frequency generator 102 is realized by a 60 MHz RF generator; thus, presenting a frequency ratio of 1 to 150. As a consequence, in these embodiments the filter 104 may suppress power at a frequency that is less than a percent away from a center frequency.

And in many embodiments, the suppression of power at the frequency of the high-frequency generator 102 is, at most, 2 dB, and the suppression of power at frequencies more than the frequency of the low-frequency generator 108 from the frequency of the high-frequency generator 102 is at least 2 dB higher than the suppression of power at the frequency of the high-frequency generator 102. In some implementations, the bandwidth of the filter 104 is 2% (or less) of the frequency of the high-frequency generator 102. If the high-frequency generator 102 is realized by a 60 MHz RF generator, for example, the bandwidth of the filter may be 1.2 MHz or less.

Figure 4A:
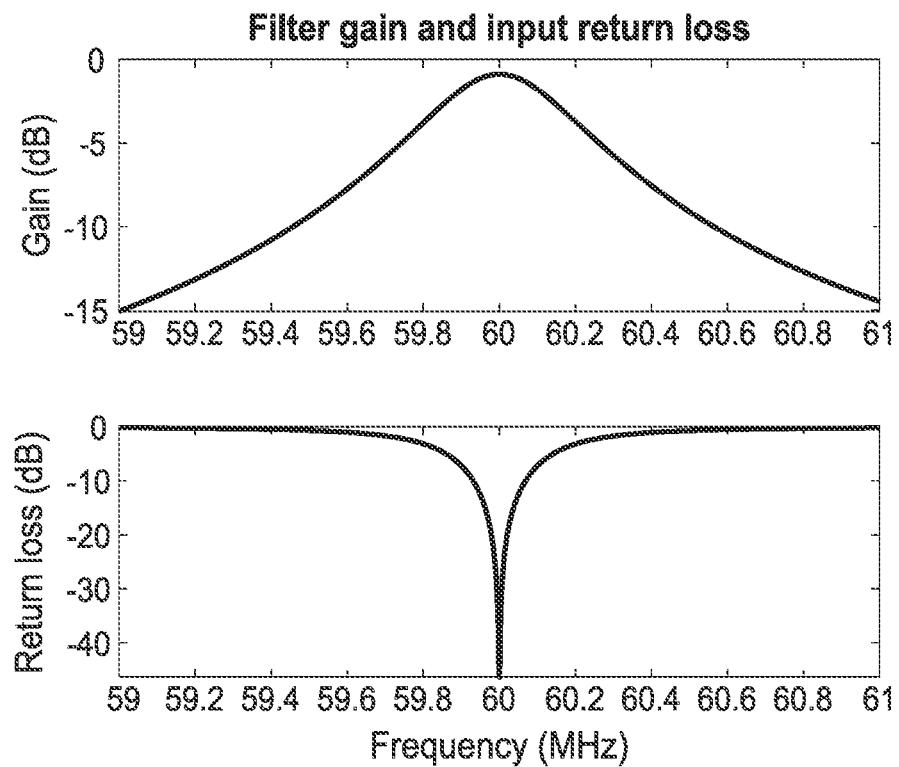
FIG. 4A includes two graphs depicting performance aspects for an exemplary design of the filter depicted in FIG. 1.
Figure 4B:
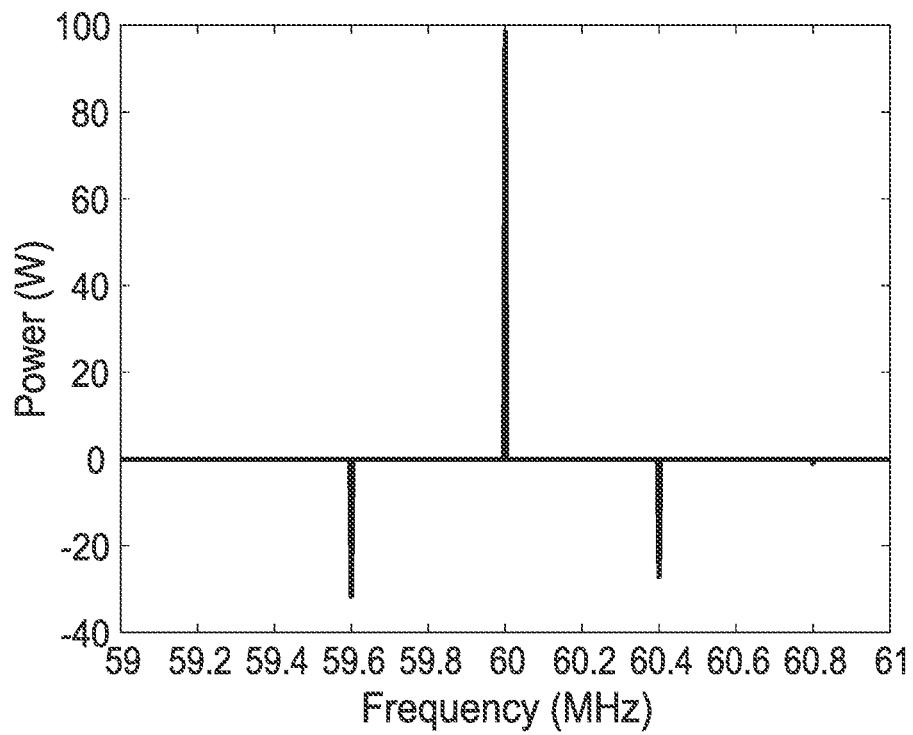
FIG. 4B is a graph depicting the net power that may be delivered to the plasma load by the high-frequency generator at the fundamental and mixing product frequencies when the filter depicted in FIG. 1 is not utilized.

Referring to FIG. 4A, shown are graphs depicting performance aspects for exemplary designs of the filter 104. In FIG. 4A, a bandwidth of the filter 104 has a center frequency of about 60 MHz, and at a fraction of a megahertz away from the center frequency, power is suppressed by 8 dB. FIG. 4B shows the net power that may be delivered to the plasma load by the high-frequency generator when the filter depicted in FIG. 1 is not utilized. FIG. 4B shows that the filter with a response such as shown in FIG. 4A will allow power delivered to the plasma load at the fundamental frequency of 60 MHz to pass from the high-frequency generator 102 to the plasma load with relatively high efficiency and suppress the power reflected from the plasma load back to the high-frequency generator 102.

But those of ordinary skill in the art have not been led to implement the filter 104 with characteristics that are similar to the filter characteristics in FIG. 4A. A lack of awareness of the underlying problem of plasma modulation is one reason. But in addition, designing a filter with the characteristics depicted in FIG. 4A is challenging (even at low power levels). But in many embodiments the filter 104 handles high amounts of power (e.g., several kW of power), and the high-power and narrow-band combination is not a combination that those of skill in the art are likely to try.

Figure 5A:
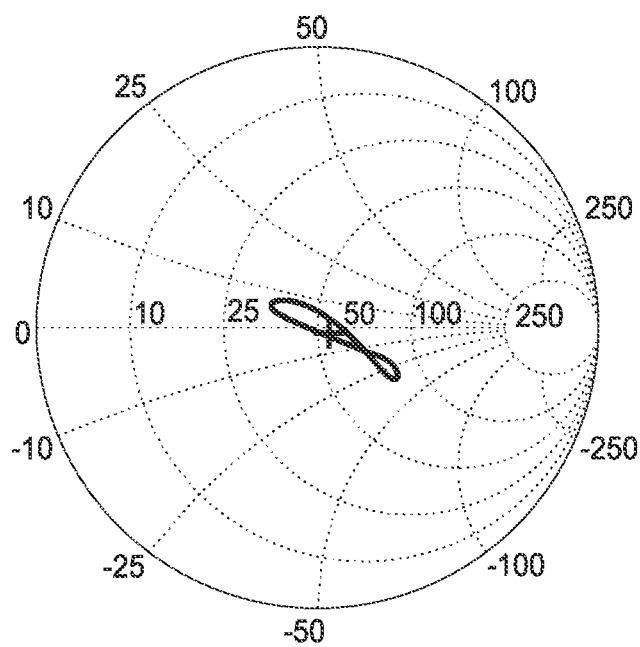
FIGS. 5A and 5B are graphs depicting modulation of load reflection coefficient.
Figure 5B:
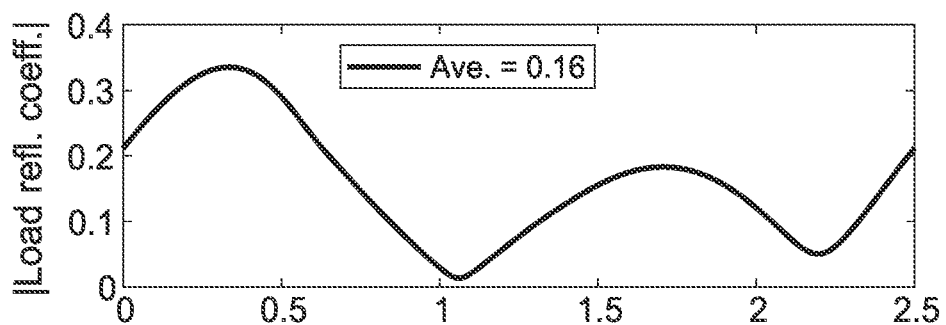

As discussed above, FIGS. 3A and 3B depict a load reflection coefficient as seen by the high-frequency generator when the filter 104 is not utilized. And FIGS. 5A and 5B depict a load reflection coefficient as seen by the high-frequency generator 102 when an exemplary filter 104 is implemented. As shown in FIG. 5A, when the filter 104 is deployed, the reflection coefficient is compressed to stay much closer to the center of the graph (as compared to the load reflection coefficient in FIG. 3A) over the cycle of the plasma's modulation.

Figure 5C:
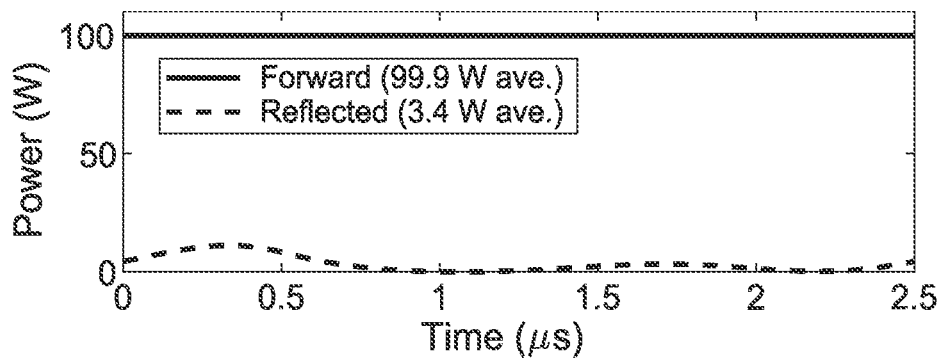
FIG. 5C is a graph depicting resulting reflected power that may be seen by the high-frequency generator when the filter depicted in FIG. 1 is utilized.

Referring to FIG. 3B, shown is a depiction of reflection coefficient magnitude in the time domain without the filter 104 being utilized. The corresponding level of forward power (close to 100 watts) depicted in FIG. 3C is much lower than the power utilized during plasma processing, but the reflection coefficient depicted in FIG. 3B, and relative magnitudes of forward and reflected power in FIG. 3C, is instructional. As shown, forward power is 99.8 watts and reflected power is 63.4 watts. In contrast, as shown in FIG. 5C, with the filter 104 in place, there are 99.9 watts of forward power and 3.4 watts of reflected power; thus, the high-frequency generator 102 is placed under much less stress. And on the load side of the filter 104, as shown in FIG. 6C, the filter 104 may increase the average forward power.

Figure 7:
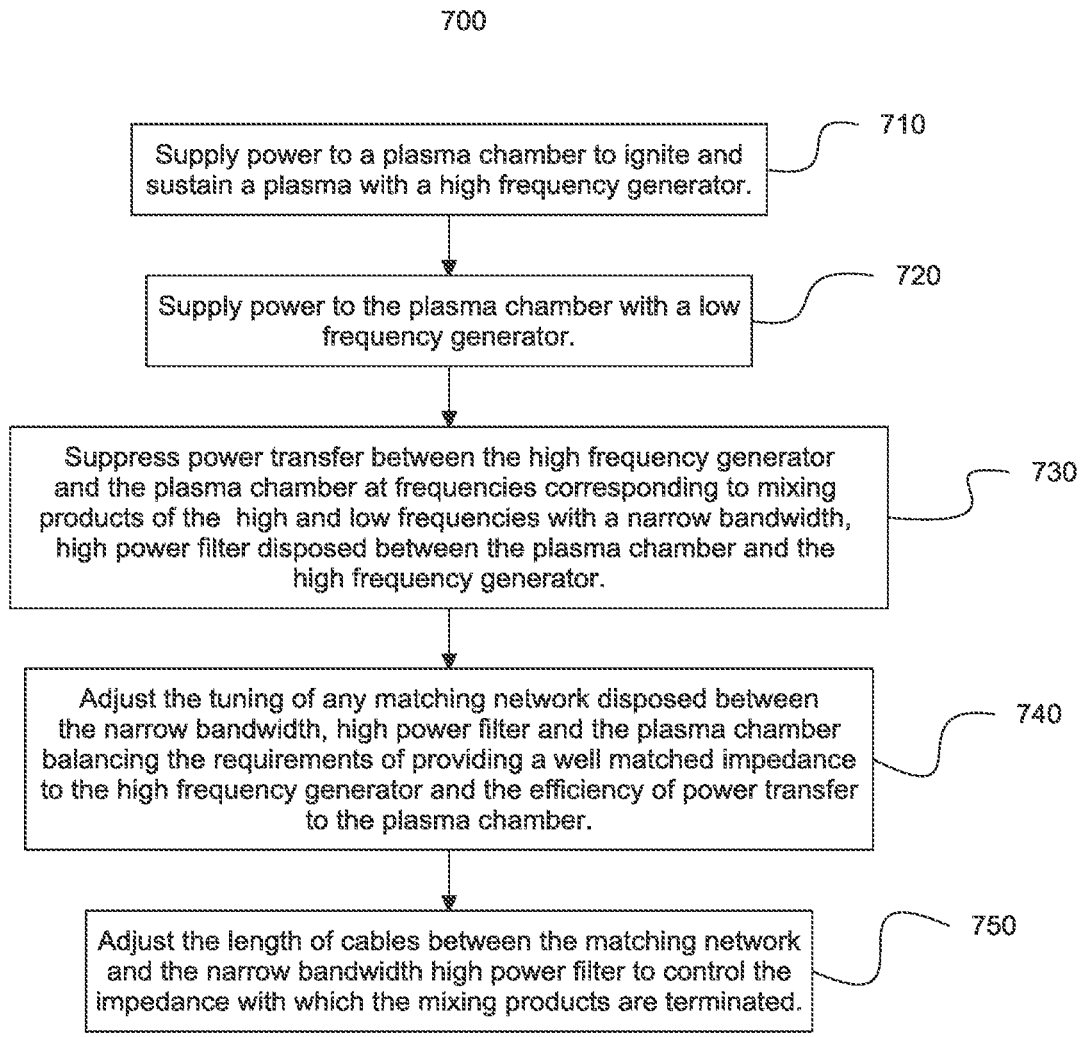
FIG. 7 is a flowchart depicting a method that may be traversed in connection with embodiments disclosed herein.

Referring to FIG. 7, shown is a flowchart 700 depicting a method for plasma processing in a modulated plasma system. As shown, power is supplied to the plasma chamber 100 with the high-frequency generator 102 to ignite and sustain a plasma (Block 710). In addition, power is supplied to the plasma chamber 100 with the low-frequency generator 108 (Block 720). Power transfer between the high-frequency generator 102 and the plasma chamber 100 is suppressed at frequencies corresponding to mixing products of the high and low frequencies with the filter 104 disposed between the plasma chamber 100 and the high-frequency generator (Block 730). The tuning of the match network 106 may be adjusted (e.g., optimized) to balance the requirements of providing a well-matched impedance to the high-frequency generator 102 and the efficiency of power transfer to the plasma chamber 100 (Block 740).

Figure 6A:
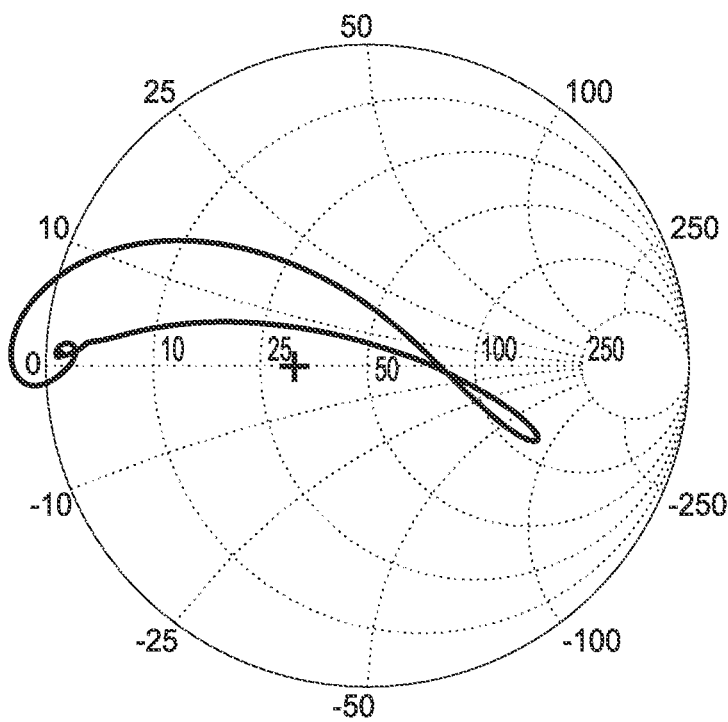
FIGS. 6A and 6B are graphs depicting modulation of load reflection coefficient.
Figure 6B:
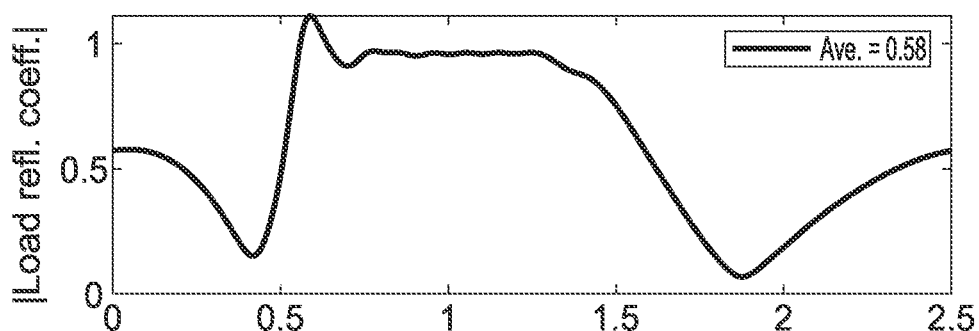
Figure 6C:
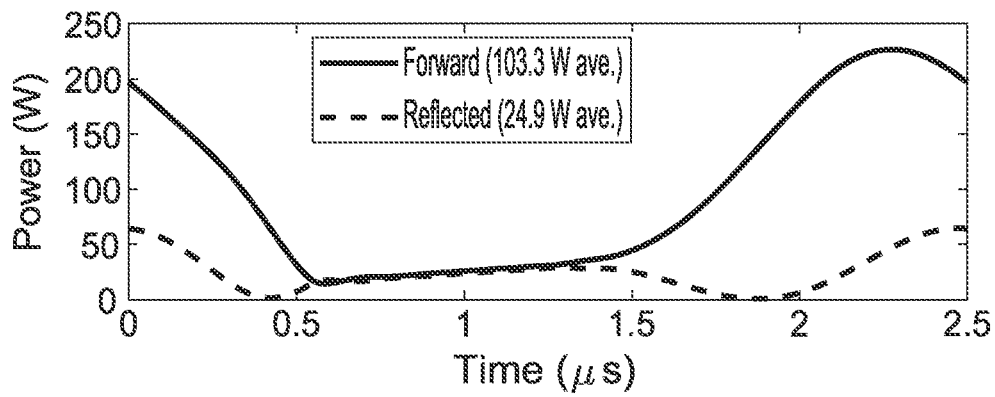
FIG. 6C is a graph depicting resulting reflected power that may be seen by the filter depicted in FIG. 1.

Referring briefly back to FIG. 6A, note that the trajectory of the load reflection coefficient is not symmetrical around the origin as is the case in FIG. 3A. This is a characteristic of the impedance required on the load side of the filter 104 in order to match the input of the filter 104 to a load reflection coefficient that is close to zero and get efficient power transfer from the high-frequency generator 102 to the plasma load. The average load reflection coefficient on the load side of the filter 104 is indicated with a "+" in FIG. 6A. The average value of the load reflection coefficient on the load side of the filter 104 as indicated in FIG. 6A is approximately $-0.23-j0.00$. The average value of the load reflection coefficient on the high-frequency generator 102 side of the filter 104 as indicated in FIG. 5A is approximately $0.04-j0.02$. This illustrates an aspect of using this filter 104, namely that the load reflection coefficient on the load side of the filter 104 is not tuned to a matched load (50 ohm in most systems), but is typically set to achieve a low, time-averaged load reflection coefficient magnitude as measured by a wideband measurement system. As a consequence, in many implementations, the wideband measurement component 116 or 120 is utilized to capture at least the first order mixing products. The wideband measurement systems 116 or 120 may be implemented as an integral component of the matching network 106, the high frequency generator 102, or may be implemented as a separate component. Thus, the step of adjusting the matching network at Block 740 is different from what is normally required of a matching network 106.

In many implementations, the impedance presented to the filter 104 by the plasma chamber 100 is adjusted to optimize efficiency of power transfer from the high-frequency generator 102 to the plasma chamber 100. For example, the time-average of an absolute value of the load reflection coefficient presented to the filter may be minimized, and the load reflection coefficient may be measured (e.g., by the wideband measurement system 116 or 120) using a bandwidth at least equal to the frequency of the low-frequency generator 108. It is also contemplated that a time-average of a load reflection coefficient is optimized away from 0+j0.

Referring again to FIG. 7, a length of cables between the matching network 106 and the filter 104 may be adjusted (e.g., optimized) to control the impedance with which the mixing products are terminated (Block 750). Although cable lengths (between a match network and a plasma processing chamber) are adjusted in other plasma processing systems (e.g., for stability), when the filter 104 is used, there are additional considerations when choosing this cable length, namely: the termination impedance provided to the plasma system at the frequencies of the mixing products by the filter 104; cables connecting the filter 104 to the matching network 106; and the matching network 106. Changing the cable length changes the nature of the modulation on the load side of the filter 104. This cable length also affects frequency tuning in multi-state applications; thus, the choice of this cable length may be more complicated than in prior plasma processing systems.

Figure 8A:
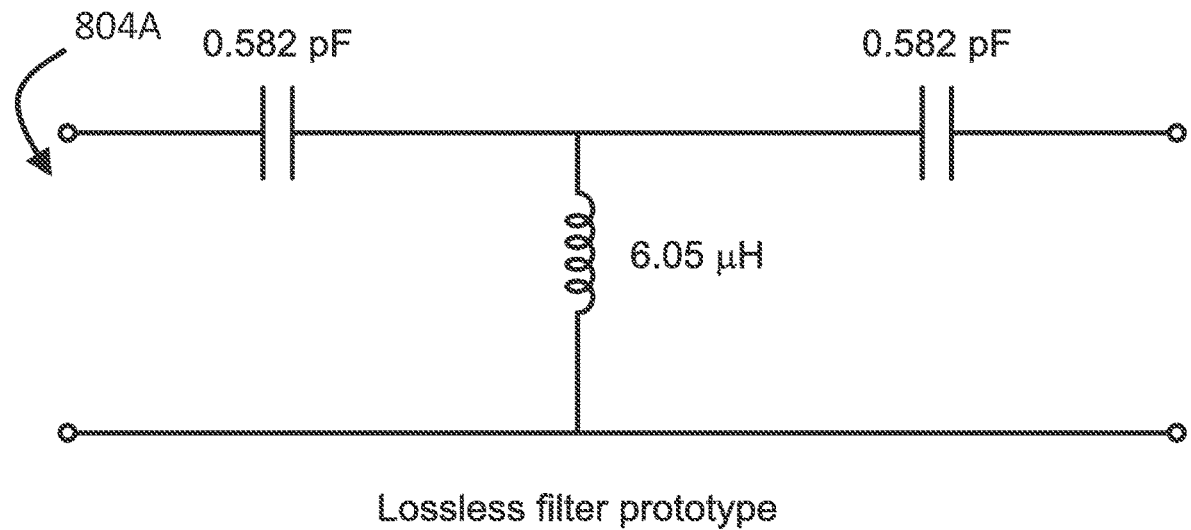
FIGS. 8A and 8B are diagrams depicting equivalent circuits of embodiments of the filter described with reference to FIG. 1.
Figure 8B:
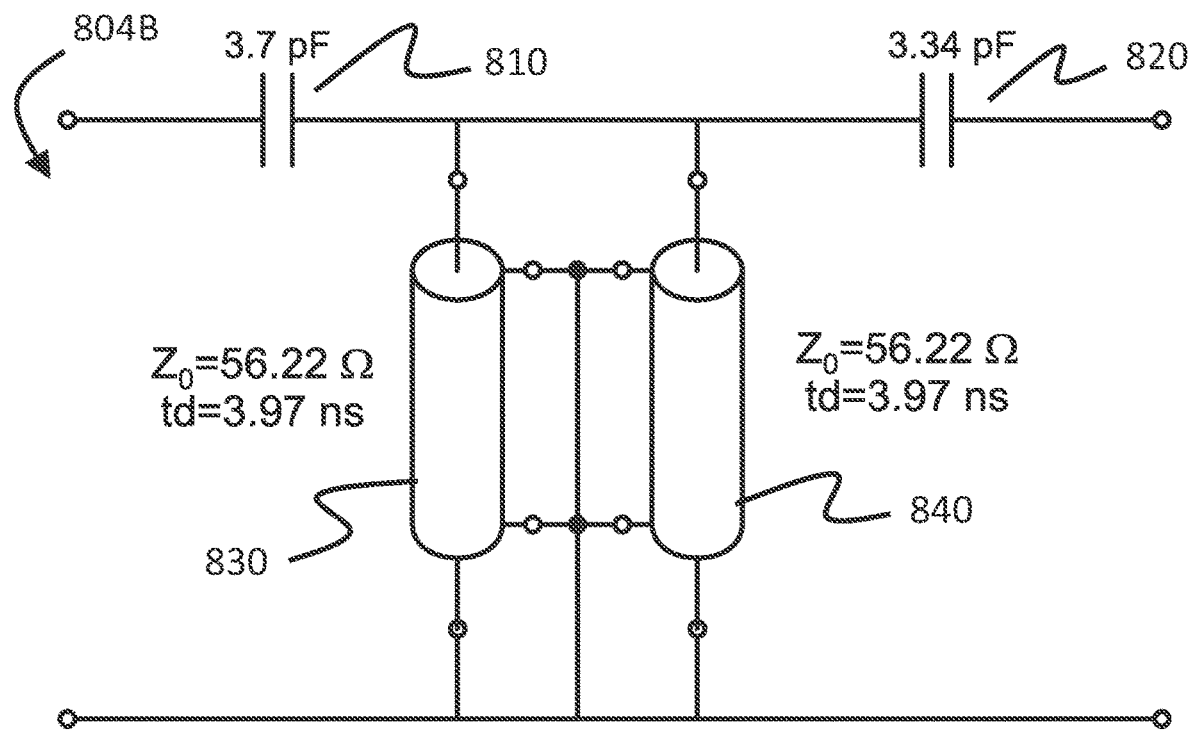

FIGS. 8A and 8B are equivalent circuits of embodiments of the filter 104 described with reference to FIG. 1. FIG. 8A shows the equivalent circuit of a lossless prototype, and FIG. 8B shows the equivalent circuit of the filter 104 when reduced to practice using realizable lossy components. There are other ways of realizing such a narrowband, high power filter (for example using a large ring resonator or cavity), but in all cases careful attention must be paid to high voltages, high currents, and high-power dissipation present in such filters.

Figure 9:
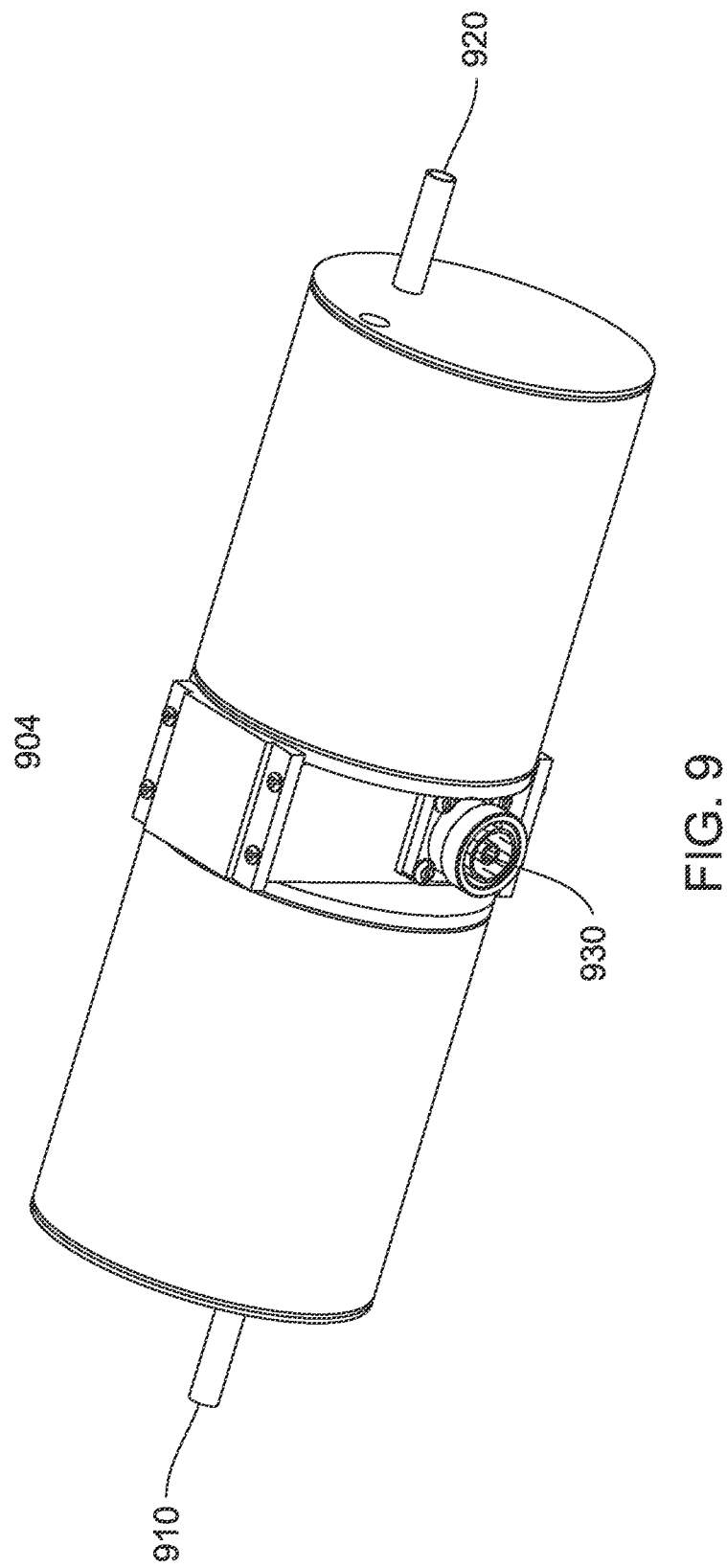
FIG. 9 is a perspective view of an exemplary water-cooled filter design with two parallel helical resonators.

Referring next to FIG. 9, shown is a perspective view of the exterior of a water-cooled filter 904 designed with two parallel helical resonators. The filter contains two water connections 910 and 920 for passing water through the filter for cooling, an input connector 930, and an output connector (not visible in this view).

Figure 10:
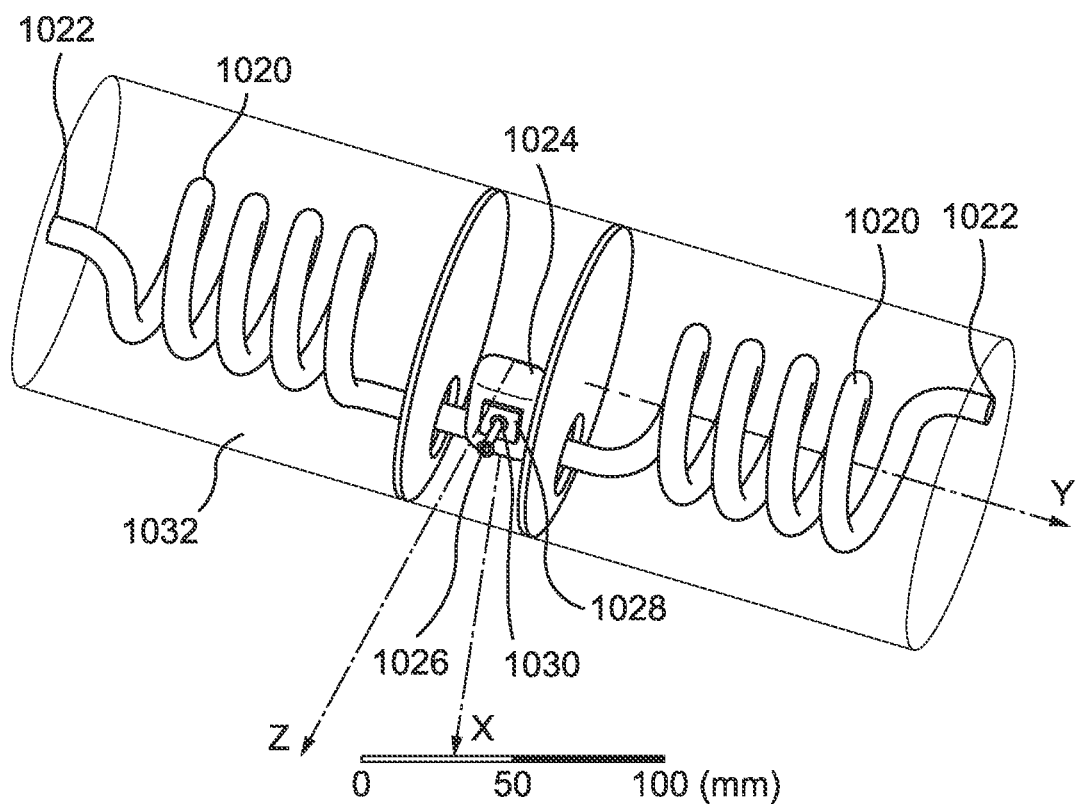
FIG. 10 is a view of the interior of a water-cooled filter design with two parallel helical resonators.

FIG. 10 is a view of the interior of the filter 904 design with two parallel helical resonators. As shown, each of the helical resonators includes a hollow helical coil 1020, and each hollow helical coil 1020 is coupled to a copper block 1024. Extending from the copper block 1024 are copper straps 1026, and insulating the copper straps 1026 from the copper block 1024 are ceramic insulators 1028. In this implementation, metallization 1030 is disposed on the ceramic 1028 to form input and output capacitors 810 and 820. In addition, each hollow helical coil 1020 includes a grounded end 1022. The filter 904 also includes a potted cylindrical enclosure 1032 (represented transparently for purposes of viewing internal components of the filter 104) that surrounds the hollow helical coils 1020 and the copper block 1024.

Figure 11:
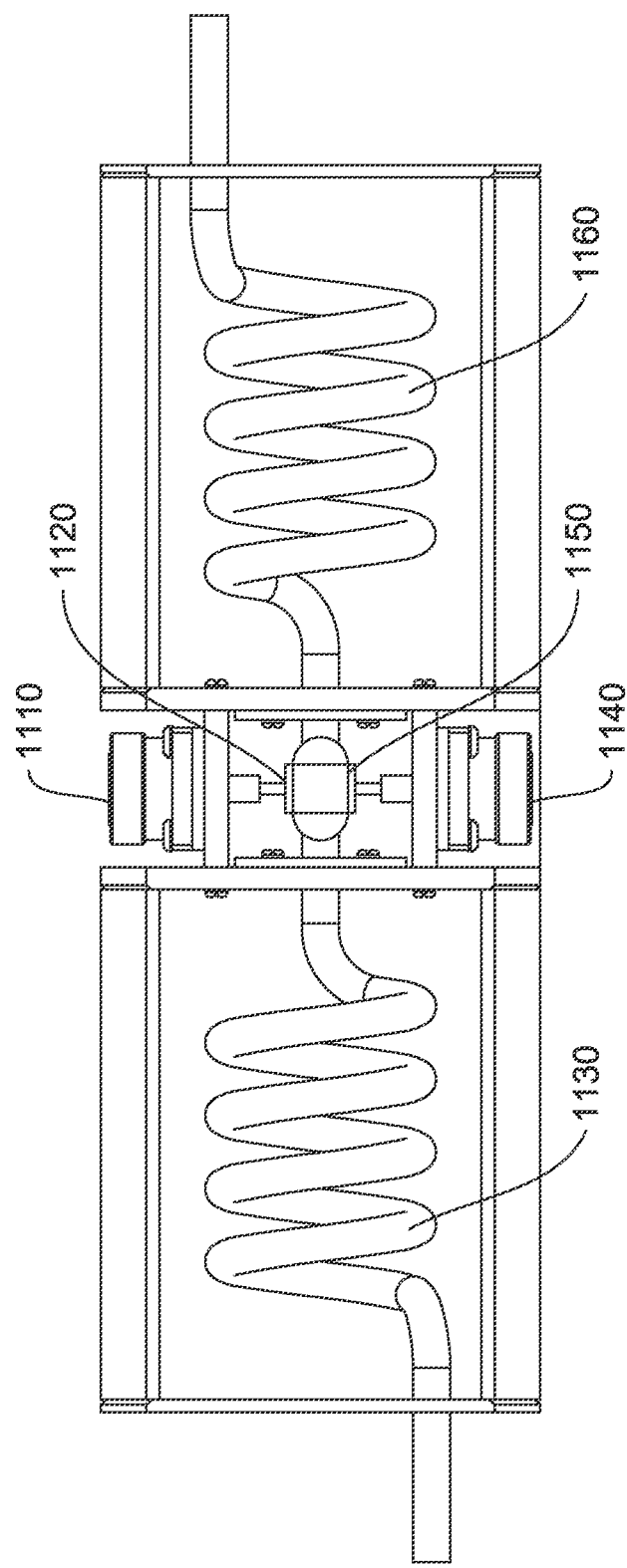
FIG. 11 is a cutaway view of a water-cooled filter design with two parallel helical resonators.

FIG. 11 shows a cutaway view of the filter 904. This view shows how the copper straps 1026 connect to the input and output connectors, 1110 and 1140, to the capacitors formed on the ceramic insulators 1120 and 1150. This view also shows how the hollow helical coils 1130 and 1160 connect to the copper block 1024.

Figure 12:
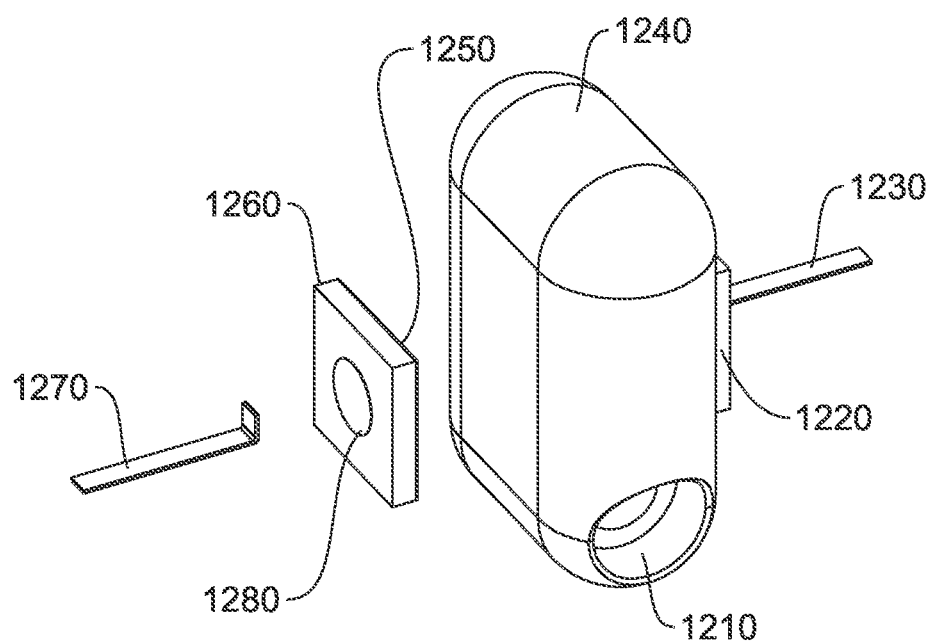
FIG. 12 is a detail view of the capacitor block of a water-cooled filter design with two parallel helical resonators.

FIG. 12 shows more detail of the copper block 1240 (1024 in FIG. 10). This assembly provides the required capacitive coupling from the input and output to the helical resonators. Due to the small value of the capacitors required, the high voltage the capacitors must withstand, and the power the capacitors must dissipate, implementing the capacitors on a ceramic substrate is used in the design of the filter. The copper block contains a water channel 1210 into which the hollow helical coils are attached (by e.g. soldering). The capacitors formed on the ceramic insulators 1220 and 1260 are thus water cooled. The ceramic insulators have front and back metallization 1280 and 1250, respectively. The size of the front metallization 1280 controls the capacitance realized by the assembly. The ceramic insulators can be attached to the copper block 1240 using electrically conductive epoxy. The straps 1270 and 1230 can be soldered to the front metallization and to the connectors 1110 and 1140.

Figure 13:
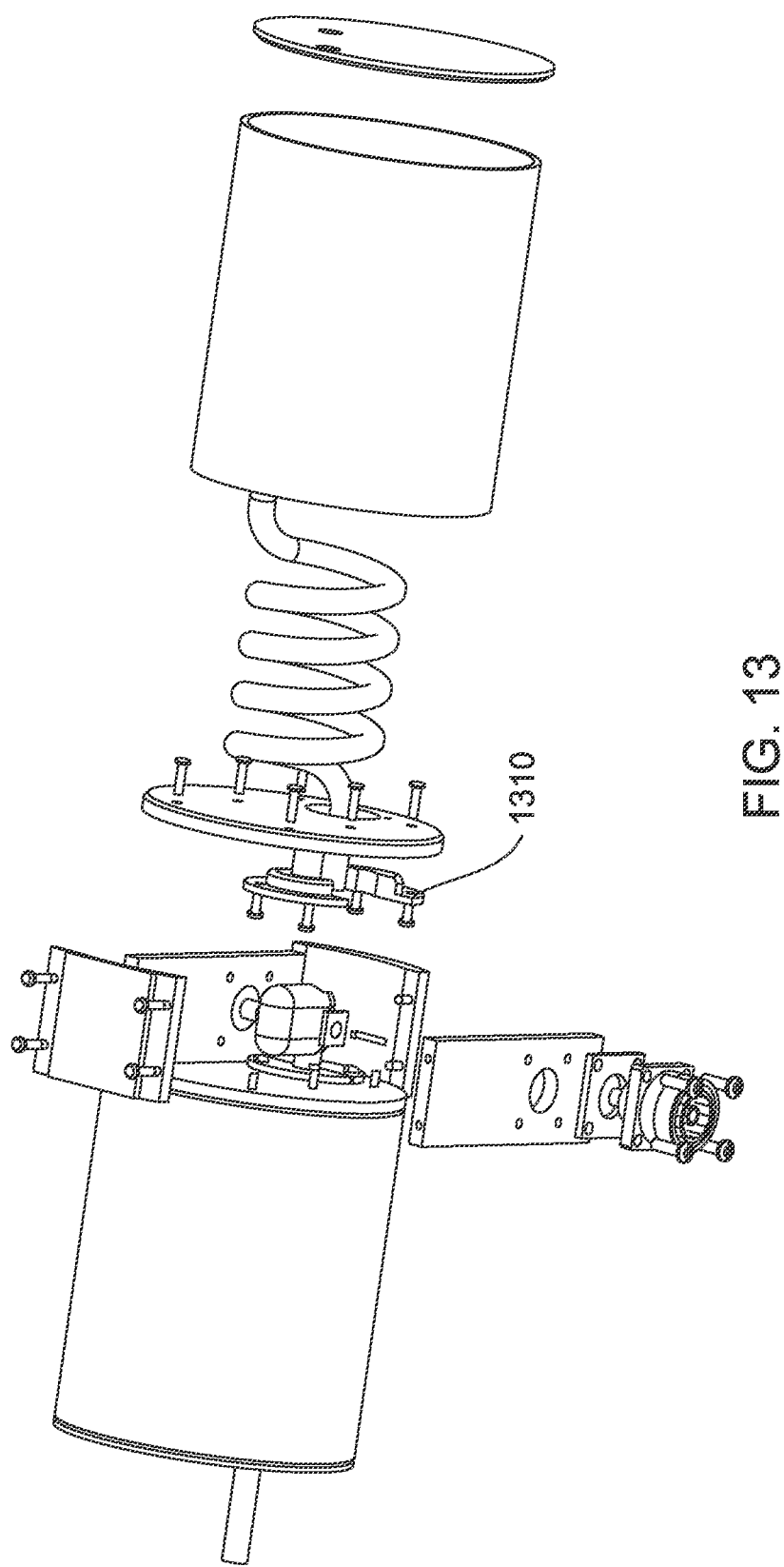
FIG. 13 is an exploded view of a water-cooled filter design with two parallel helical resonators.

FIG. 13 shows an exploded view of the filter 904. An insulating bracket 1310 holds the hollow helical coils in place and provides mechanical stability to the assembly. The bracket is made from a suitable low loss dielectric material, e.g. PTFE plastic or ceramic and contains holes to allow the potting material to flow through. Due to the high voltages that may be encountered in this design, the high voltage area of the filter is potted (e.g. using silicone dielectric gels) to reduce the risk of failure due to the breakdown of air. Alternatively, the entire assembly can be evacuated to a high vacuum, filled with a high-quality dielectric liquid, or filled with an insulating pressurized gas such as, but not limited to, sulfur hexafluoride (SF6).

It should be recognized that those of ordinary skill in the art, in view of the present disclosure, are able to design aspects of the helical coils 1020 (e.g., a number of turns, radius, length, pitch, inner and outer coil diameter, and outside diameter of coil) to achieve the desired bandwidth and heat dissipation. It should also be recognized that variations of the design of the filter 904 depicted in FIGS. 9-13 are certainly contemplated.

Using helical resonators close to resonance on the low frequency or inductive side of resonance rather than an inductor achieves a similar bandwidth as compared to a design using an inductor, but in contrast to a design with an inductor, the helical resonators provide a smaller effective inductance. In addition, using two resonators in parallel allows ground-connected water cooling of the entire assembly where the water system can remain grounded. More specifically, water provided from the ground-connected water system is fed through the hollow helical coils 1020 enabling a large amount of heat to be dissipated. For example, the filter 904 (and variations of the filter 904) may operate at relatively high-power levels (e.g., in the 1 kW to 30 kW power range). By virtue of its design, the filter 904 (and its variations) may operate at relatively high-power levels while operating at efficiencies of at least 75%.

Figure 14:
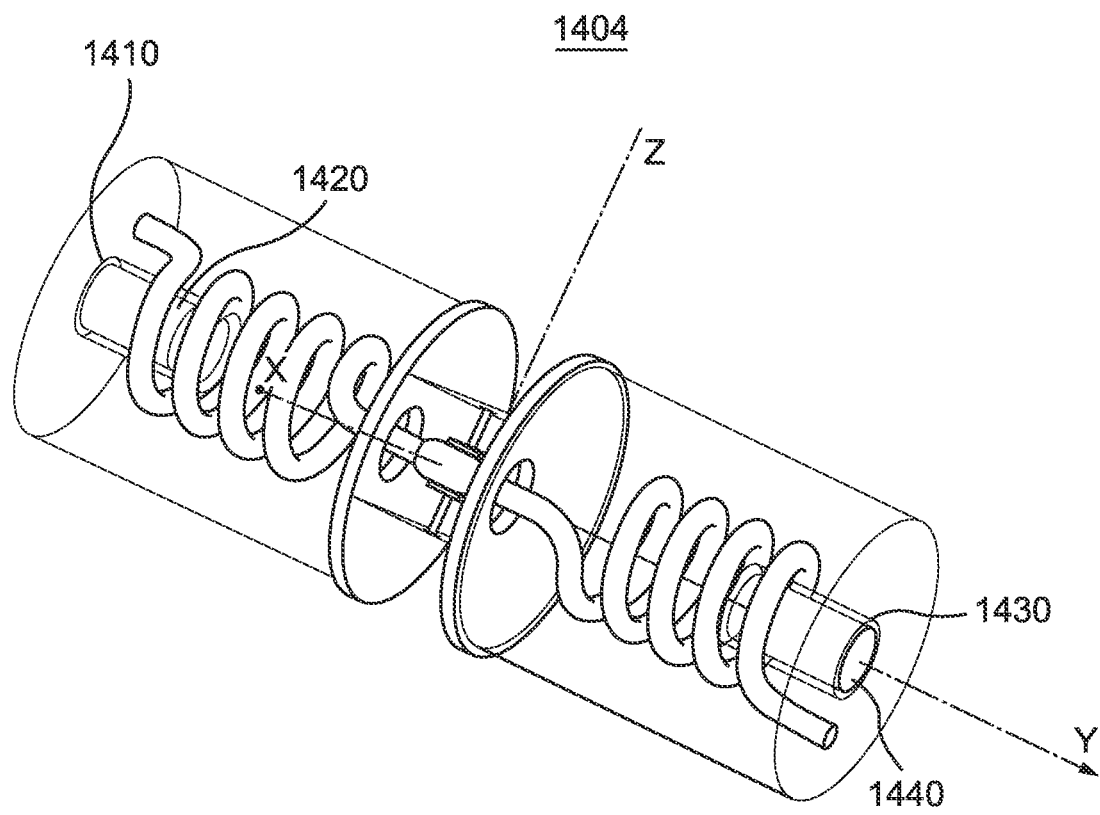
FIG. 14 is a view of a filter including provision to tune the filter.

FIG. 14 shows a filter 1404 with tuning slugs. Tuning may be required for setting the passband frequency of the filter due to component manufacturing tolerance but may also be actively adjusted to compensate for changes in component values due to, for example, self-heating of the filter 1404. The tuning slugs 1420 and 1440 may be, for example, ferrite rods that may be moved along the depicted Y axis within the hollow helical coils 1020, but more typically, the tuning slugs may be made of copper. Cups 1410 and 1430 made of suitable insulators (e.g. PTFE plastic) provide an area free of potting compound in which the tuning slugs can be moved.

The use of the filter 104, 804B, 904, 1404 compresses the frequency range over which frequency tuning (for impedance matching) can be done to a very small frequency range. This requires a different approach to deal with multi-state operation of the generator. An example of multi-state operation may be switching between multiple power levels in which each power level represents a state and in which the high-frequency generator 102 sees a different load impedance in each state due to the nonlinear nature of the plasma load and where the high-frequency generator 102 may operate at a different frequency in each state in order to improve impedance matching or stability for that state. To facilitate multi-state operation in a system using the filter 104, one may need to ensure that the impedances presented to the load side of the filter 104 for the different states lie along or close to the line of impedances that can be matched by frequency tuning the high-frequency generator 102 frequency. This can be done by adding a fixed or variable time-delay, such as delay element 112, on the load side of the filter.

Figure 15:
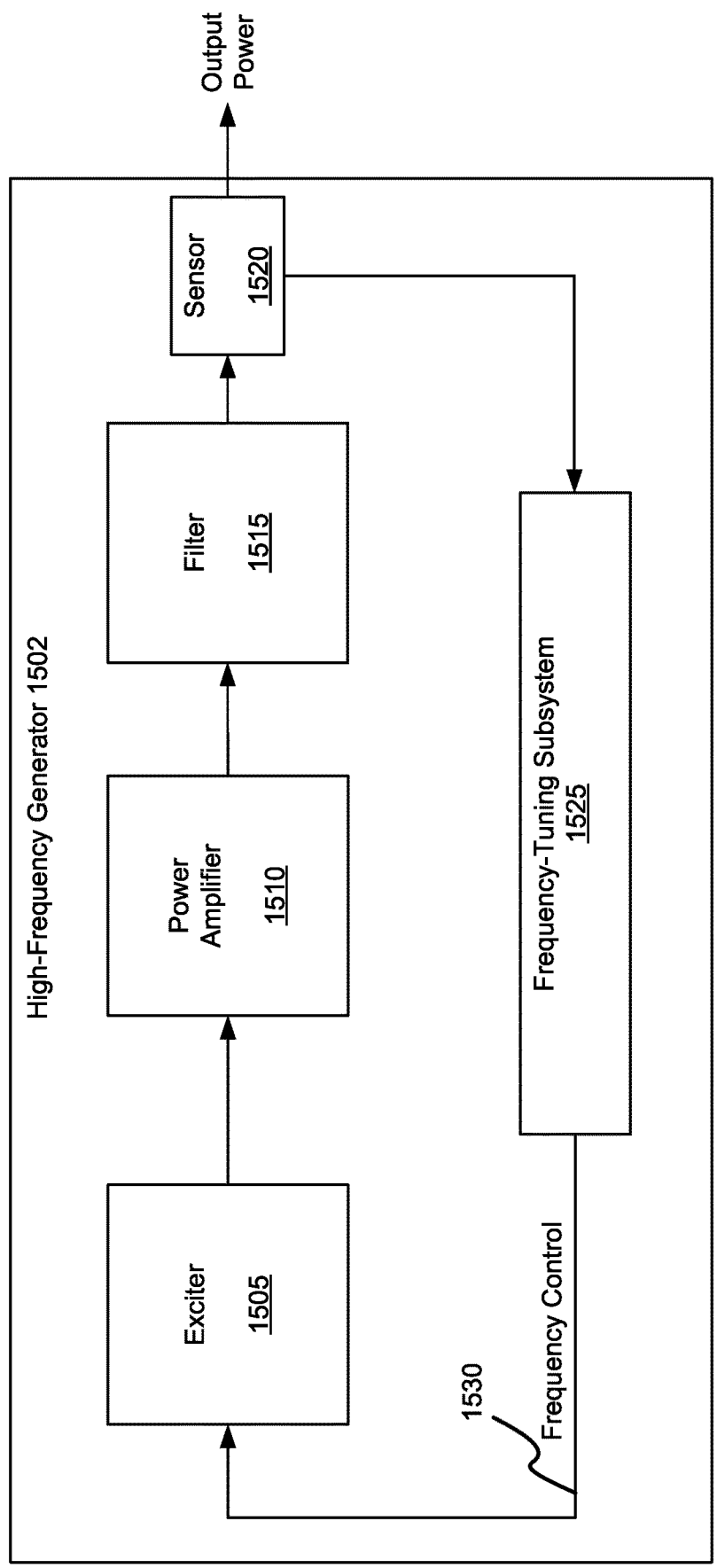
FIG. 15 is a block diagram depicting an exemplary high-frequency generator.

An aspect of the present disclosure is frequency tuning of the high-frequency generator 102 to adjust an impedance presented to the high-frequency generator. Referring to FIG. 15 for example, shown is a block diagram of a high-frequency generator 1502 that may be used to realize the high-frequency generator 102 described with reference to FIG. 1. As shown, the high-frequency generator 1502 includes an exciter 1505, power amplifier 1510, filter 1515, sensor 1520, and frequency-tuning subsystem 1525. The exciter 1505 generates an oscillating signal at RF frequencies, typically in the form of a sinusoidal or square wave. Power amplifier 1510 amplifies the signal produced by exciter 1505 to produce an amplified oscillating signal. For example, the power amplifier 1510 may amplify an exciter output signal of 1 mW to 3 kW. Filter 1515 is optional (and distinct from filter 104) and may filter the amplified oscillating signal to produce a signal composed of a single RF frequency (a sinusoid).

The sensor 1520 measures one or more parameters indicative of the plasma load in plasma processing chamber 100. In one embodiment, sensor 1520 measures power parameters indicative of the impedance, Z, of the plasma load. Depending on the particular embodiment, sensor 1520 can be, for example and without limitation, a VI sensor or a directional coupler.

A measure of how close the load impedance is to the desired impedance can take many forms, but typically it is expressed as a reflection coefficient $$\Gamma = \frac{Z - Z_0}{Z + Z_0^*}$$

where $\Gamma$ (gamma) is the reflection coefficient of the impedance Z with respect to the desired impedance $Z_0$. The magnitude of the reflection coefficient ($|\Gamma|$) is a very convenient way to express how close the impedance Z is to the desired impedance $Z_0$. Both Z and $Z_0$ are in general complex numbers.

In general, the frequency-tuning subsystem 1525 receives the measurements indicative of the impedance, Z, of the plasma load from sensor 1520 and processes those measurements to produce frequency adjustments that are fed to exciter 1505 via a frequency control line 1530 to adjust the frequency generated by exciter 1505.

As an alternative to sensor 1520 (as discussed below), the sensor 114 may be used to measure power parameters on a load side of the filter 104, and the wideband measurement system 116 may provide a signal to the frequency-tuning subsystem 1525 that is indicative of an impedance, Z, of the plasma load.

The frequency-tuning subsystem 1525 performs computations (based upon frequency tuning methodologies) to generate frequency adjustments (e.g., frequency steps) that are fed to exciter 1505 via frequency control line 1530. In some use cases, the objective is to adjust the frequency of exciter 1505, thereby changing the impedance of the plasma load, in a manner that minimizes $|\Gamma|$ (i.e., that achieves a $\Gamma$ as close to zero as possible). The frequency that achieves this minimum $|\Gamma|$ may be termed the target frequency. As those skilled in the art understand, an ideal complex reflection coefficient of zero corresponds to a matched condition in which the plasma-load impedance is perfectly matched to the desired impedance $Z_0$. In other embodiments, the objective is not minimum $|\Gamma|$. Instead, frequency-tuning subsystem 1525 intentionally tunes exciter 1505 to generate a frequency other than the frequency that produces minimum $|\Gamma|$. Such an embodiment may be termed a "detuned" implementation and the target frequency may not minimize $\Gamma$.

Figure 16:
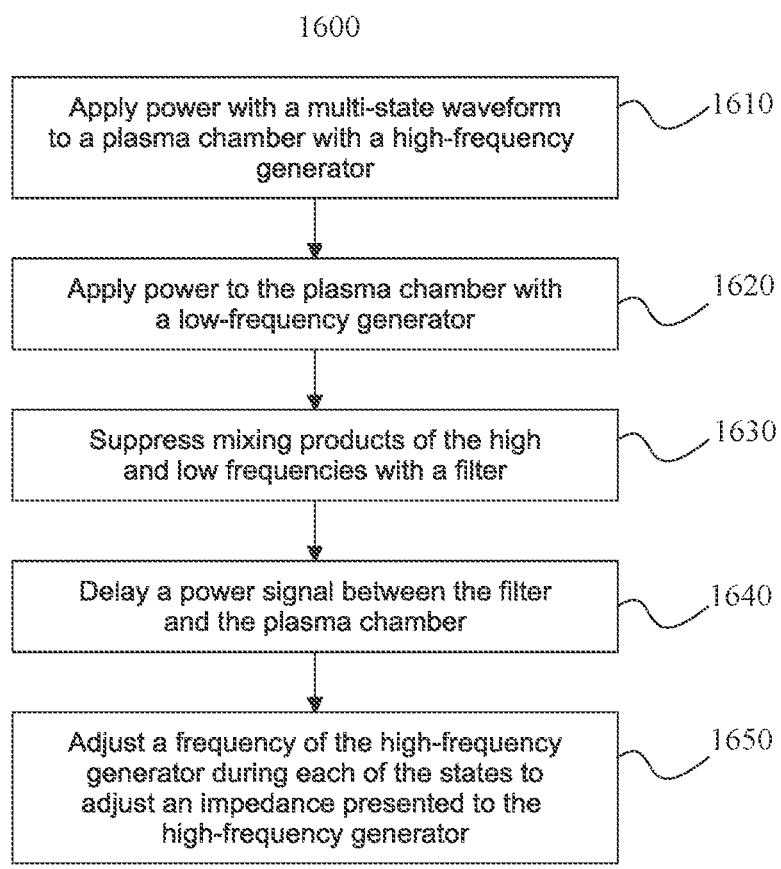
FIG. 16 is a flowchart depicting a method that may be traversed in connection with embodiments disclosed herein.

Referring next to FIG. 16, shown is a flowchart 1600 depicting a method that may be carried out in connection with embodiments disclosed herein. As shown, power with a multi-state waveform is applied to the plasma chamber 100 with the high-frequency generator 102, 1502 (Block 1610), and power is also applied to the plasma chamber 100 with a low frequency generator 108 (Block 1620). Mixing products of the high and low frequencies are suppressed with the filter 104 (Block 1630). And as shown, a power signal between the filter 104 and the plasma chamber 100 is delayed (Block 1640), and a frequency of the high-frequency generator 102 is adjusted during each of the states to adjust an impedance presented to the high-frequency generator (Block 1650).

Accurate power measurement may require measuring power on the load side of the filter 104 with a bandwidth sufficient to capture a sufficient number of mixing products. This is so because the efficiency of the filter 104 is dependent on the trajectory of the load impedance presented to the filter 104. Measuring on the high-frequency generator 102 side of the filter 104 may not provide an accurate measure of power delivered to the plasma load because it is difficult if not impossible to take into account the efficiency of the filter 104.

A variety of different frequency tuning methods may be used to adjust the frequency of the high-frequency generator 102 at Block 1650. In general, the frequency tuning methods determine which direction to adjust the frequency (whether to increase or decrease the frequency) and determine a magnitude of the frequency step used when a change is made to the frequency.

Assuming that a desirable frequency of operation is a frequency at which the magnitude of the load reflection coefficient is at or substantially close to its minimum, it is noted that the relationship between the controlled variable (frequency) and the error is not necessarily monotonic. Furthermore, the optimum point of operation is at a point where the gain (defined as change in error divided by change in frequency) is zero.

To add to the challenges, it is also possible that local minima may exist in an area which a control method can get trapped. In some special cases, where a priori information about the load is known, it is possible to arrange for an error function to be a monotonic function of frequency, so that a simple linear controller may be used. For example, such a system is disclosed in U.S. Pat. No. 6,472,822, entitled "Pulsed RF Power Delivery for Plasma Processing," issued to Chen et al., on Oct. 29, 2002. Such linear control is rarely applicable due to the non-monotonic relationship between frequency and error, except in those special cases where a priori information about the load is available.

It has been found that two common problems with plasma loads are: (1) the nonlinear nature of the load because the plasma load impedance is a function of power level; and (2) the load impedance changes over time because of changing chemistry, pressure, temperature and other physical characteristics of the non-linear plasma load. Another problem that is unique to plasma (or plasma-like) loads is that the plasma can extinguish if the delivered power to the plasma falls below a minimum value for a long enough time. Thus, a frequency where insufficient power is delivered to the plasma load cannot be applied for very long, or the plasma will extinguish.

Moreover, when the power (e.g., RF power) to the load is pulsed, frequency tuning becomes even more problematic. Due to the nonlinear nature of the load and the relatively high quality factor (ratio of stored energy to energy delivered per cycle (e.g., RF cycle), often denoted by "Q") that impedance matching networks employ, the load impedance changes very rapidly during the first few microseconds of the applied pulse (e.g., RF pulse).

U.S. Pat. No. 7,839,223 entitled "Method and Apparatus for Advanced Frequency Tuning," issued 23 Nov. 2010 to van Zyl, et al. (the '223 patent), which is incorporated by reference, discloses a variety of frequency tuning approaches that may be utilized in connection with embodiments disclosed herein. In one approach described in the '223 patent, the frequency step size is permitted to increase if the error (e.g., a difference between a desired value of gamma and an actual value of gamma) is decreasing step-over-step, and the frequency step may decrease (or stay constant) if the error is increasing step-over-step. This approach may be utilized in connection with embodiments disclosed herein to help keep up with a time-varying load.

One method for simultaneous application of a multi-state waveform (e.g., pulsing) and frequency tuning discards information at the start of the pulse while the impedance is still rapidly changing and effectively controls frequency using only information once the load impedance is stable. This approach avoids the need for tuning within the pulse but manages to obtain a good average frequency of operation.

To avoid aliasing affects, the measurement and control may be synchronized with the rising edge of the pulse. By delaying the start of the measurement and control cycle from the start of the pulse, reasonable operation on plasma-type loads is possible. Typically discarding the first 10 microseconds after the start of the pulse is sufficient to achieve reasonable results.

In some cases it is not possible to totally discard information at the start of a pulse, but it is undesirable to use intra-pulse information due to the danger of aliasing effects, or due to insufficient control bandwidth, or due to the risk of unstable operation due to the high bandwidth requirements placed on the frequency control system. By using memory, it is possible to design a system with similar performance to a true intra-pulse control system, but which is implemented using a lower speed stable controller controlling on inter-pulse information.

Figure 17:
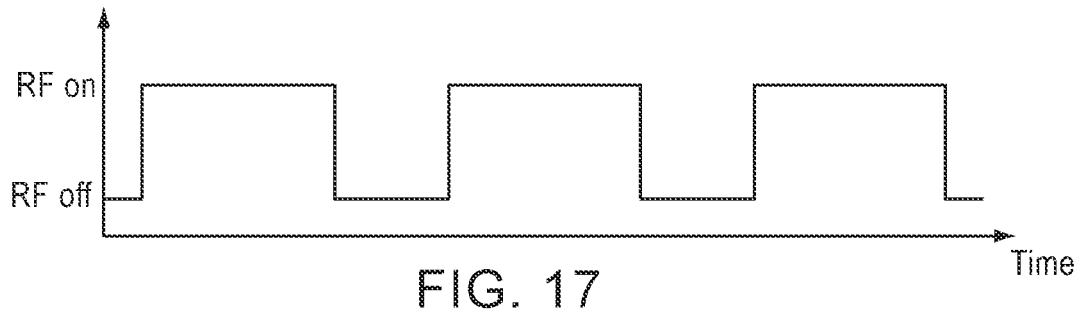
FIG. 17 is a graph depicting a multi-state waveform that may be applied by the high-frequency generators of FIGS. 1 and 15.
Figure 18:
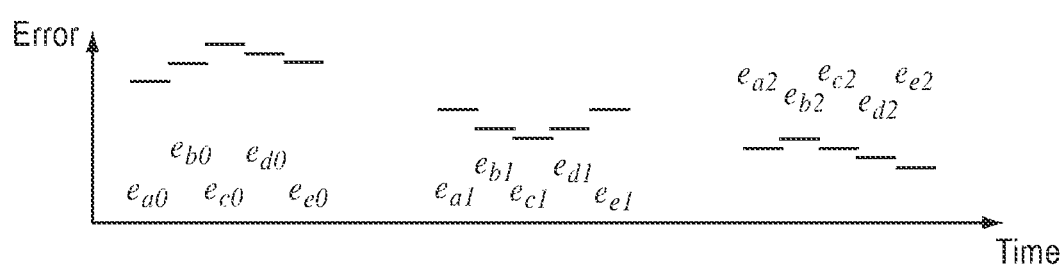
FIG. 18 is a graph depicting exemplary operation aspects of a frequency tuning method.
Figure 19:
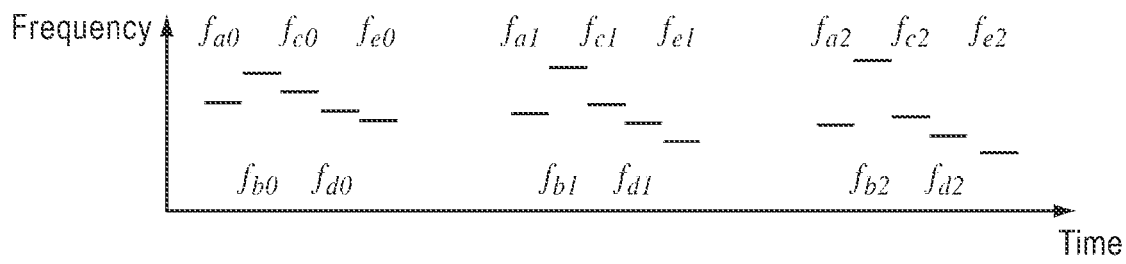
FIG. 19 is a graph depicting additional operation aspects of the frequency tuning method described with reference to FIG. 18.

Since the measurement and control cycle may be synchronized with the pulse, it is possible to use identical time slots in sequential pulses and a slower (than an intra-pulse controller) control system to control the frequency on an inter-pulse basis. In addition, measurements of identical timeslots of sequential pulses may be combined with measurements of time slots adjacent to those time slots. Not only the frequency, but also other control parameters may be stored and used by the control system to, for example, control delivered power to the load. Such other control parameters may include DC voltage supplied to the power devices, gate bias voltage in the case of MOSFETs (base emitter in case of bipolar devices) and RF drive level. Graphs depicting operation of an inter-pulse-controlled system for a high pulse repetition frequency are shown in FIGS. 17, 18, and 19. If the pulse on time becomes very long, it may be more advantageous to simply ignore information from the first few time slots, or switch to intra-pulse control at some time later in the pulse.

FIGS. 17, 18 and 19, viewed together, illustrate the disclosed inter-pulse frequency tuning. In this scheme, $f_{a2}$ is a function of only (or predominantly if adjacent time slots are also considered with some weighting) $e_{a0}$, $e_{a1}$ and $f_{a1}$. Similarly, $f_{b2}$ is a function of only (or predominantly) $e_{b0}$, $e_{b1}$ and $f_{b1}$, and so forth.

Another problem is getting trapped in local non-optimal minima Using the fact that there is a fixed time in which the plasma can operate with substantially reduced power without extinguishing, it is possible to sample and store information about operation at frequencies completely different from the current operating point. Assuming that the plasma will not extinguish if power is substantially reduced for a short enough time, T, the method works by operating, for example, 99% of the time at the optimum frequency (as determined by the frequency tuning method) and using the remaining 1% of the time in time slots not exceeding T in duration to explore operation at other frequencies. In some implementations, power may be delivered at a selected frequency for at least 90% of a total time and power may be delivered at a test frequency during test periods that are no longer than 10% of the total time.

In some implementations, a value of the test frequency may change from test period to test period. In other implementations, the same test frequency is visited multiple times, each time adjusting the power delivered to the plasma load towards a desired power level.

Although many variations are possible, the following method is exemplary and illustrative. Consider operating for a time equal to 99T at the optimum frequency and then switching to a different test frequency for a time of T. The entire frequency range from $f_{min}$ to $f_{max}$ can be divided into, for example, 16 equally spaced frequencies $f_0$ through $f_{15}$. The number of frequencies in which to divide the entire frequency range is a function of the known quality factor of the matching circuits employed. Sixteen is a typical number to make sure the true optimal point will not be missed in subsequent searches for the optimal frequency.

The method may start by sequentially searching $f_0$ through $f_{15}$ in the time slots of duration T to find a coarse optimum. The space may need to be searched a few times because the power control system may not be able to adjust the power correctly within the time T. Due to the nonlinear nature of the typical loads encountered, it is beneficial to measure the load reflection coefficient (or other error metric used by the method) at or close to a desired power level. By storing the control value and power level every time that a frequency is visited, the correct power level can be attained after a few visits to the same frequency.

Once the coarse optimum has been found, for example at $f_k$, where k is an integer from 0 to 15, then the method may start using the time slots of length T to find an optimum. One option is to go to $f_{16}=0.5(f_{k-1}+f_k)$ provided k>0 and $f_{17}=0.5(f_{k+1})$ provided k<15. The frequency at which the error is at a minimum between $f_{16}$, $f_k$ and $f_{17}$ then becomes the new desired frequency. The interval to the left and right of the new optimum is again split in two, and the minimum among the previous minimum and the two newly tested frequencies is selected. And when the minimum frequency happens to be $f_{min}$, or $f_{max}$, only one new frequency is generated. Due to the fact that the interval is split in half every time, the optimum frequency is found with sufficient accuracy within just a few iterations. And because the load is generally time-variant, once the optimum frequency has been found, the method generally has to start over to make sure conditions have not changed and a new global optimum has not been created.

Figure 20:
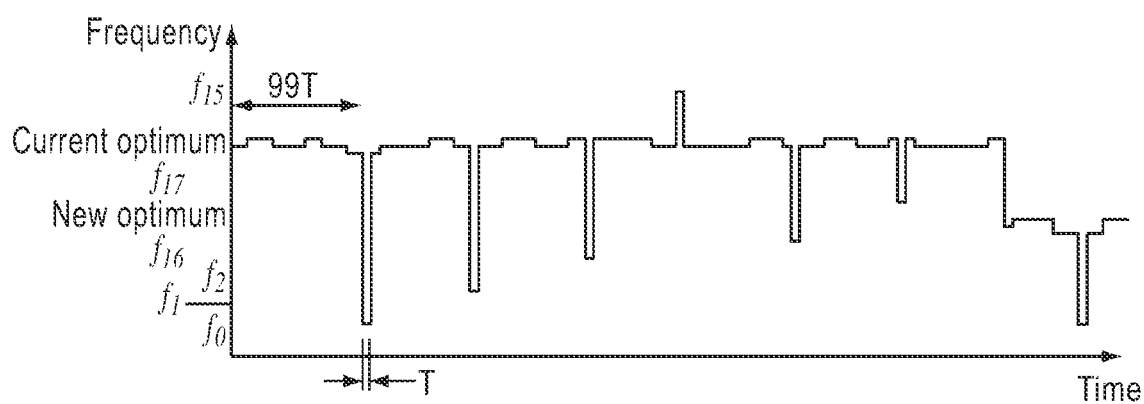
FIG. 20 is a graph depicting operational aspects of yet another frequency tuning method.

While this method to find the global optimum is being executed, the previously described local tuning method can be run during the 99T time slot to maintain operation at the current local minimum. And staying at the current optimum frequency 99% of the time ensures that the average delivered power to the load remains virtually unchanged. FIG. 20 graphically illustrates exemplary operating characteristics that may be associated with a method which uses a small percentage of the time with a maximum time slot T to search for a global optimum frequency.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

Figure 21:
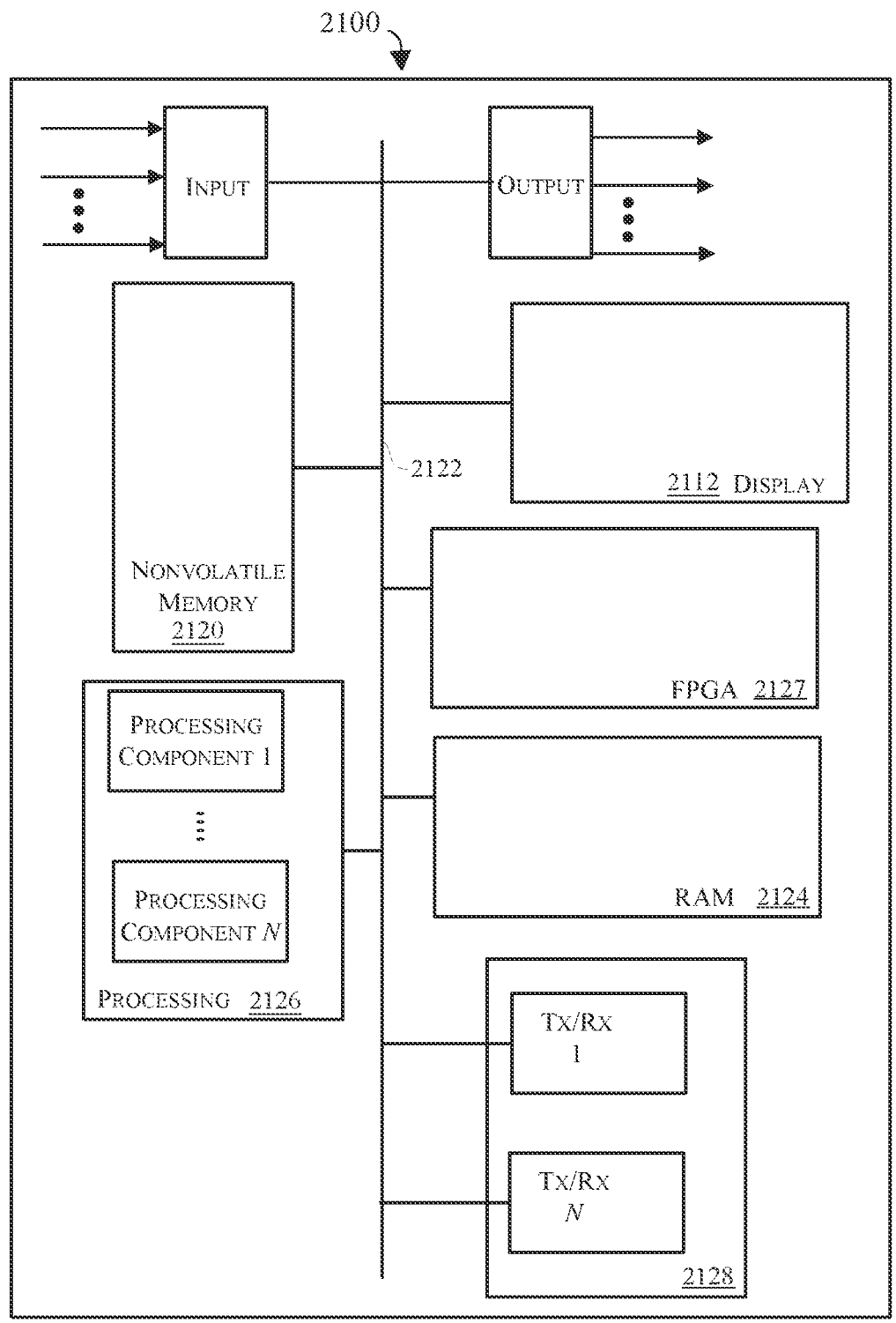
FIG. 21 is a block diagram depicting a computing device that may be utilized in connection with embodiments disclosed herein.

Referring to FIG. 21, shown is an example of a computing system 2100 that may be utilized in connection with the embodiments disclosed herein. As shown, a display portion 2112 and nonvolatile memory 2120 are coupled to a bus 2122 that is also coupled to random access memory ("RAM") 2124, a processing portion (which includes N processing components) 2126, a field programmable gate array (FPGA) 2127, and a transceiver component 2128 that includes N transceivers. Although the components depicted in FIG. 21 represent physical components, FIG. 21 is not intended to be a detailed hardware diagram; thus, many of the components depicted in FIG. 21 may be realized by common constructs or distributed among additional physical components. Moreover, it is contemplated that other existing and yet-to-be developed physical components and architectures may be utilized to implement the functional components described with reference to FIG. 21.

This display portion 2112 generally operates to provide a user interface for a user, and in several implementations, the display is realized by a touchscreen display. In general, the nonvolatile memory 2120 is non-transitory memory that functions to store (e.g., persistently store) data and machine readable (e.g., processor executable) code (including executable code that is associated with effectuating the methods described herein). In some embodiments for example, the nonvolatile memory 2120 includes bootloader code, operating system code, file system code, and non-transitory processor-executable code to facilitate the execution of the methods described herein including the methods described with reference to FIGS. 7, 16, and 17-20.

In many implementations, the nonvolatile memory 2120 is realized by flash memory (e.g., NAND or ONENAND memory), but it is contemplated that other memory types may be utilized as well. Although it may be possible to execute the code from the nonvolatile memory 2120, the executable code in the nonvolatile memory is typically loaded into RAM 2124 and executed by one or more of the N processing components in the processing portion 2126.

In operation, the N processing components in connection with RAM 2124 may generally operate to execute the instructions stored in nonvolatile memory 2120 to realize aspects of the wideband measurement system 116, 120, the frequency-tuning subsystem 1525, and control aspects of the high-frequency generator 102, 1502 (e.g., frequency tuning aspects) and match 106. For example, non-transitory processor-executable instructions to effectuate aspects of the methods described with reference to FIGS. 7, 16, and 17-20 may be persistently stored in nonvolatile memory 1620 and executed by the N processing components in connection with RAM 2124. As one of ordinarily skill in the art will appreciate, the processing portion 2126 may include a video processor, digital signal processor (DSP), graphics processing unit (GPU), and other processing components.

In addition, or in the alternative, the field programmable gate array (FPGA) 2127 may be configured to effectuate one or more aspects of the methodologies described herein (e.g., the methods described with reference to FIGS. 7, 16, and 17-20). For example, non-transitory FPGA-configuration-instructions may be persistently stored in nonvolatile memory 2120 and accessed by the FPGA 2127 (e.g., during boot up) to configure the FPGA 2127 to realize aspects of the wideband measurement system 116, 120 and control aspects of the high-frequency generator 102 (e.g., frequency tuning aspects) and match 106.

The input component may operate to receive signals (e.g., from sensors 114, 118, 1520) that are indicative of one or more aspects of power. The signals received at the input component may include, for example, voltage, current, forward power, reflected power and plasma load impedance. The output component generally operates to provide one or more analog or digital signals (e.g. frequency control signal on the frequency control line 1530) to effectuate operational aspects of the generators 102, 108, match 106, and/or wideband measurements systems 116, 120. For example, the output portion may provide control signals utilized by the generators 102, 108, match 106, and/or wideband measurements systems 116, 120.

The depicted transceiver component 2128 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A plasma processing system comprising:
a high-frequency generator configured to deliver power as a multi-state waveform to a plasma;
a wideband measurement system configurable with a filter bandwidth that exceeds a modulation frequency of the plasma; and
a frequency-tuning subsystem configured to adjust, within each state, a frequency of the multi-state waveform based upon inter-pulse measurements of the multi-state waveform taken with the wideband measurement system, wherein a frequency within a particular state is controlled based upon measurements of identical time slots of sequential pulses of the particular state to adjust an impedance presented to the high-frequency generator.

2. The plasma processing system of claim 1, wherein measurements of identical timeslots of sequential pulses are combined with measurements of time slots adjacent to those time slots.

3. The plasma processing system of claim 1, wherein the wideband measurement system is configured with a bandwidth that is at least equal to 400 kHz.

4. The plasma processing system of claim 1, wherein the high-frequency generator is configured to deliver power as a multi-state waveform to a plasma at, at least, 60 MHz.

5. A plasma processing system comprising:
a high-frequency generator configured to deliver power to a plasma chamber;
a wideband measurement system configurable with a filter bandwidth that exceeds a modulation frequency of the plasma, the wideband measurement system providing an indication of an impedance presented to the high-frequency generator; and
a frequency-tuning subsystem configured to adjust a frequency of the high-frequency generator to adjust the impedance presented to the high-frequency generator;
wherein the frequency-tuning subsystem is configured to adjust the frequency of the power by:
delivering power at a selected frequency for at least 90% of a total time;
delivering power at a test frequency during test periods, wherein the test periods are no longer than 10% of the total time, wherein a value of the test frequency changes from test period to test period; and
changing a value of the selected frequency to the value of the test frequency if the impedance presented to the high-frequency generator is closer to a target impedance when the high-frequency generator is delivering power at the test frequency.

6. The plasma processing system of claim 5, wherein a same test frequency is visited multiple times, each time adjusting the power delivered towards a desired power level.

7. The plasma processing system of claim 5, wherein the wideband measurement system is configured with a bandwidth that is at least equal to 400 kHz.

8. The plasma processing system of claim 5, wherein the high-frequency generator is configured to deliver power as a multi-state waveform to a plasma at, at least, 60 MHz.

9. A plasma processing system comprising:
a high-frequency generator configured to apply a multi-state waveform to a plasma chamber;
a wideband measurement system configurable with a filter bandwidth that exceeds a modulation frequency of a plasma in the plasma chamber; and
means for adjusting, within each state, a frequency of the multi-state waveform based upon inter-pulse measurements of the multi-state waveform, wherein a frequency within a particular state is controlled based upon measurements of identical time slots of sequential pulses of the particular state to adjust an impedance presented to the high-frequency generator.

10. The plasma processing system of claim 9, wherein the means for adjusting the frequency of the multi-state waveform comprises means for adjusting the frequency of the multi-state waveform based upon inter-pulse measurements that are measurements of identical time slots of sequential pulses.

11. The plasma processing system of claim 9, wherein the wideband measurement system is configured with a bandwidth that is at least equal to 400 kHz.

12. The plasma processing system of claim 9, wherein the high-frequency generator is configured to deliver power as a multi-state waveform to a plasma at, at least, 60 MHz.

13. The plasma processing system of claim 9, wherein the means for adjusting the impedance presented to the high frequency generator comprises means for optimizing efficiency of power transfer from the high frequency generator to the plasma chamber.

14. The plasma processing system of claim 13, wherein the means for adjusting the impedance presented to the high frequency generator comprises means for minimizing a time-average of an absolute value of load reflection coefficient presented to the high-frequency generator.

15. The plasma processing system of claim 13, wherein the means for adjusting the impedance presented to the high frequency generator comprises means for adjusting a time-average of a load reflection coefficient to be optimized away from 0+j0.

* * * * *